(12) United States Patent
Mikhemar et al.

(10) Patent No.: US 8,571,489 B2
(45) Date of Patent: Oct. 29, 2013

(54) FRONT END MODULE WITH TONE INJECTION

(75) Inventors: Mohyee Mikhemar, Irvine, CA (US); Hooman Darabi, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 287 days.

(21) Appl. No.: 12/946,724

(22) Filed: Nov. 15, 2010

(65) Prior Publication Data

US 2011/0300814 A1   Dec. 8, 2011

Related U.S. Application Data

(60) Provisional application No. 61/351,284, filed on Jun. 3, 2010.

(51) Int. Cl.
 *H04B 1/40* (2006.01)
(52) U.S. Cl.
 USPC .............................................. 455/77; 455/87
(58) Field of Classification Search
 USPC ............ 455/73, 77, 78, 80, 82, 87, 104, 105, 455/107, 120, 125, 155.1, 165.1, 180.3, 455/237.1, 260, 267
 See application file for complete search history.

(56) References Cited

U.S. PATENT DOCUMENTS

| 5,434,541 | A | 7/1995 | Knoedl, Jr. |
| 2004/0227584 | A1 | 11/2004 | Lee et al. |
| 2005/0090215 | A1* | 4/2005 | Cheng et al. ............... 455/180.3 |
| 2005/0221855 | A1 | 10/2005 | Kuriyama et al. |
| 2008/0090533 | A1* | 4/2008 | Rofougaran ............... 455/161.1 |
| 2008/0175307 | A1 | 7/2008 | Brunn et al. |
| 2009/0174497 | A1 | 7/2009 | Korden |
| 2009/0253385 | A1* | 10/2009 | Dent et al. ...................... 455/83 |

FOREIGN PATENT DOCUMENTS

| EP | 2042350 A2 | 4/2009 |
| WO | 2009123583 A1 | 10/2009 |

OTHER PUBLICATIONS

Partial European Search Report for Application No. 11003987.2, dated Nov. 9, 2011.
Partial European Search Report for Application No. 11003819.7, dated Sep. 30, 2011.

* cited by examiner

*Primary Examiner* — Ping Hsieh
(74) *Attorney, Agent, or Firm* — Garlick & Markison; Bruce E. Garlick

(57) ABSTRACT

A radio front end includes a power amplifier, a tone injection module, a duplexer, a balancing network, and a processing module. The tone injection module is operable, in a first mode, to produce a tone having a carrier frequency that is substantially similar to a carrier frequency of an inbound wireless signal. The duplexer is operable, in the first mode, to provide electrical isolation between the outbound wireless signal and a combination signal of the tone and inbound wireless signal and is operable, in a second mode, to provide electrical isolation between the outbound wireless signal and the inbound wireless signal. The processing module is operable to determine an amplitude of a tone component of the combination signal; correlate the amplitude of the tone component to an inbound frequency band isolation; and adjust baseband processing of a down converted representation of the combination signal based on the inbound frequency band isolation.

20 Claims, 30 Drawing Sheets portable computing
communication device 10 portable computing
communication device 10 large signal balancing
network 882 small signal balancing
network 880

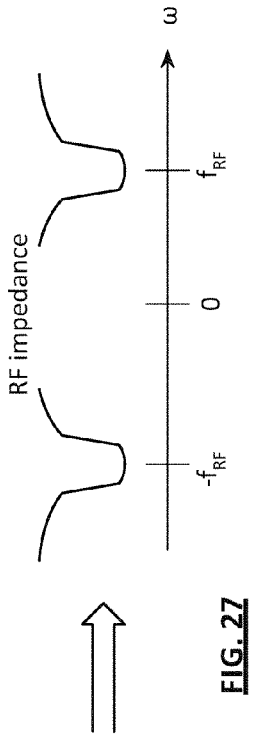
FIG. 26
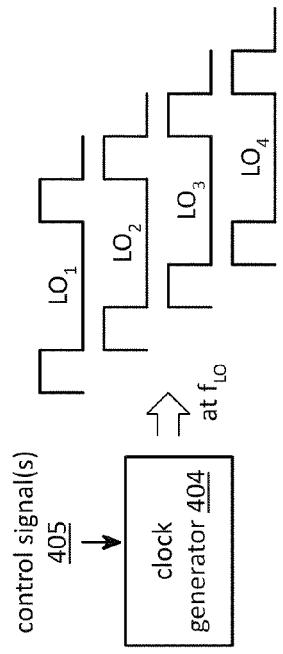
FIG. 27
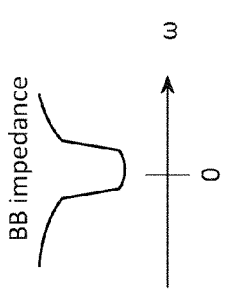
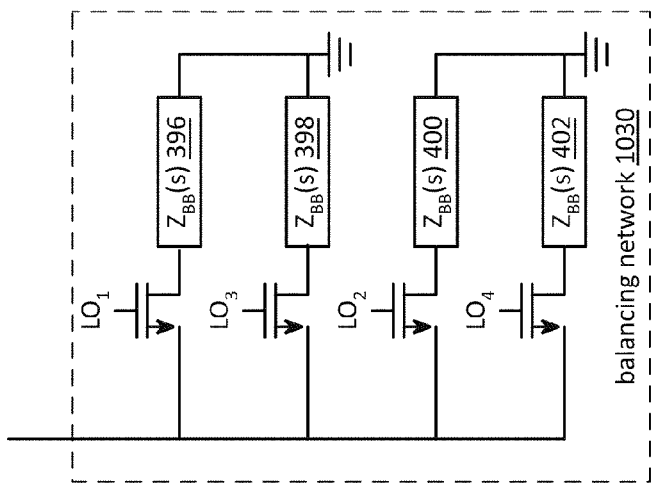
FIG. 25

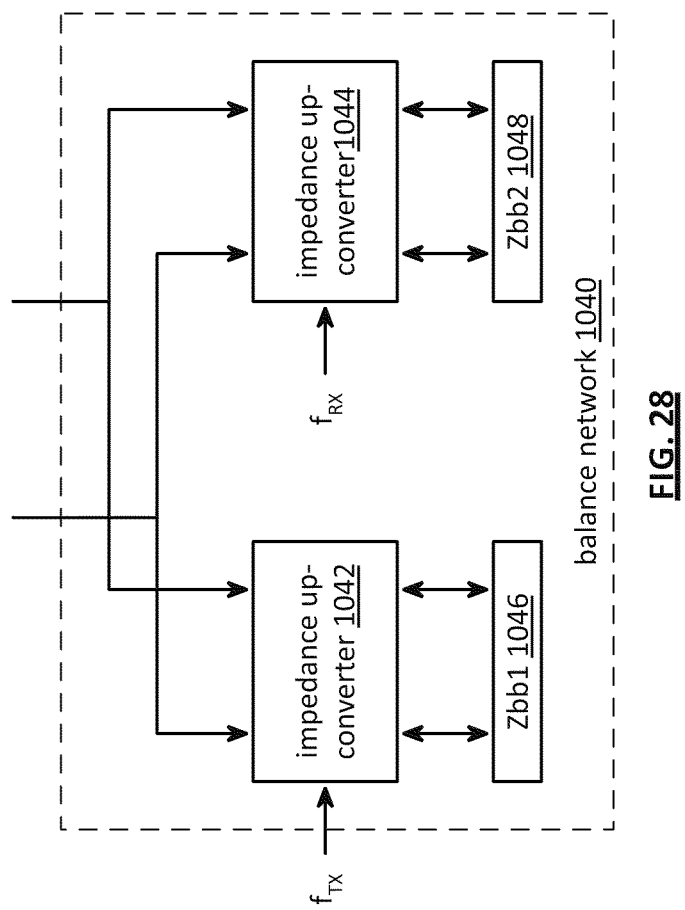

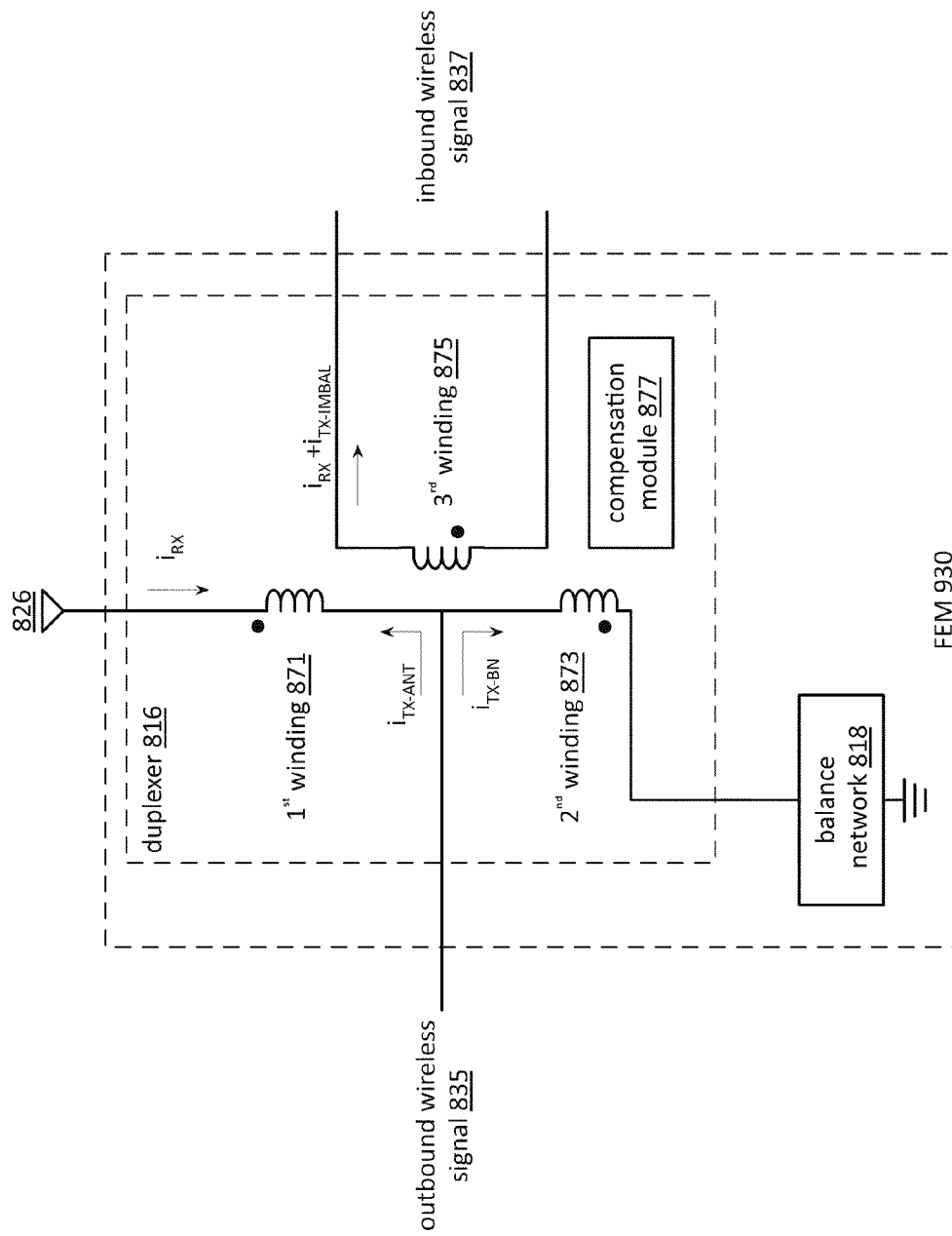

FRONT END MODULE WITH TONE INJECTION

CROSS REFERENCE TO RELATED PATENTS

This patent application is claiming priority under 35 USC §119(e) to a provisionally filed patent application entitled CONFIGURABLE AND SCALABLE RF FRONT-END MODULE, having a provisional filing date of Jun. 3, 2010, and a provisional Ser. No. 61/351,284, which is incorporated by reference herein.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to wireless communications and more particularly to radio transceivers.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), Enhanced Data rates for GSM Evolution (EDGE), General Packet Radio Service (GPRS), WCDMA, LTE (Long Term Evolution), WiMAX (worldwide interoperability for microwave access), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to an antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers data from the filtered signals in accordance with the particular wireless communication standard.

As is also known, the transmitter includes a data modulation stage, one or more intermediate frequency stages, and a power amplifier. The data modulation stage converts data into baseband signals in accordance with a particular wireless communication standard. The one or more intermediate frequency stages mix the baseband signals with one or more local oscillations to produce RF signals. The power amplifier amplifies the RF signals prior to transmission via an antenna.

To implement a radio transceiver, a wireless communication device includes a plurality of integrated circuits (ICs) and a plurality of discrete components. FIG. 1 illustrates an example of a wireless communication device that supports 2G and 3G cellular telephone protocols. As shown, the wireless communication device includes a baseband processing IC, a power management IC, a radio transceiver IC, a transmit/receive (T/R) switch, an antenna, and a plurality of discrete components. The discrete components include surface acoustic wave (SAW) filters, power amplifiers, duplexers, inductors, and capacitors. Such discrete components add several dollars (US) to the bill of material for the wireless communication device, but are necessary to achieve the strict performance requirements of the 2G and 3G protocols.

As integrated circuit fabrication technology evolves, wireless communication device manufacturers require that wireless transceiver IC manufacturers update their ICs in accordance with the advancements in IC fabrication. For example, as the fabrication process changes (e.g., uses smaller transistor sizes), the wireless transceiver ICs are redesigned for the newer fabrication process. Redesigning the digital portions of the ICs is a relatively straightforward process since most digital circuitry "shrinks" with the IC fabrication process. Redesigning the analog portions, however, is not a straightforward task since most analog circuitry (e.g., inductors, capacitors, etc.) does not "shrink" with the IC process. As such, wireless transceiver IC manufacturers invest significant effort to produce ICs of newer IC fabrication processes.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIG. 25 is a schematic block diagram of another embodiment of a balancing network in accordance with the present invention;

FIG. 26 is a schematic block diagram of an embodiment of a clock generator for clocking a balancing network in accordance with the present invention;

FIG. 27 is a diagram of an operational example of the balancing network of FIG. 25 in accordance with the present invention;

FIG. 28 is a schematic block diagram of another embodiment of a balancing network in accordance with the present invention;

FIG. 29 is a schematic block diagram of another embodiment of a portion of each of a front-end module (FEM) in accordance with the present invention;

DETAILED DESCRIPTION OF THE INVENTION

Figure 1:
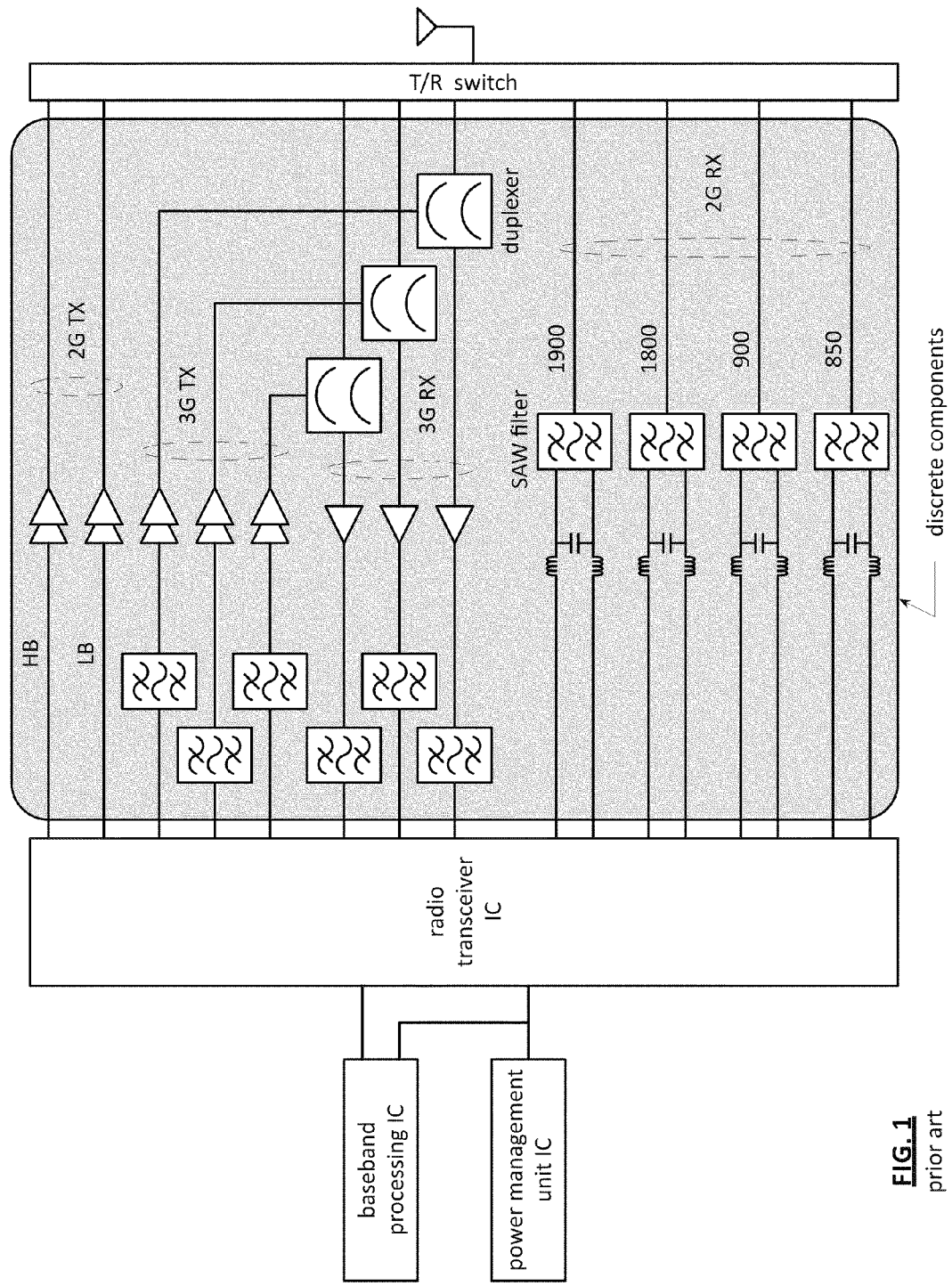
FIG. 1 is a schematic block diagram of a prior art wireless communication device.
Figure 2:
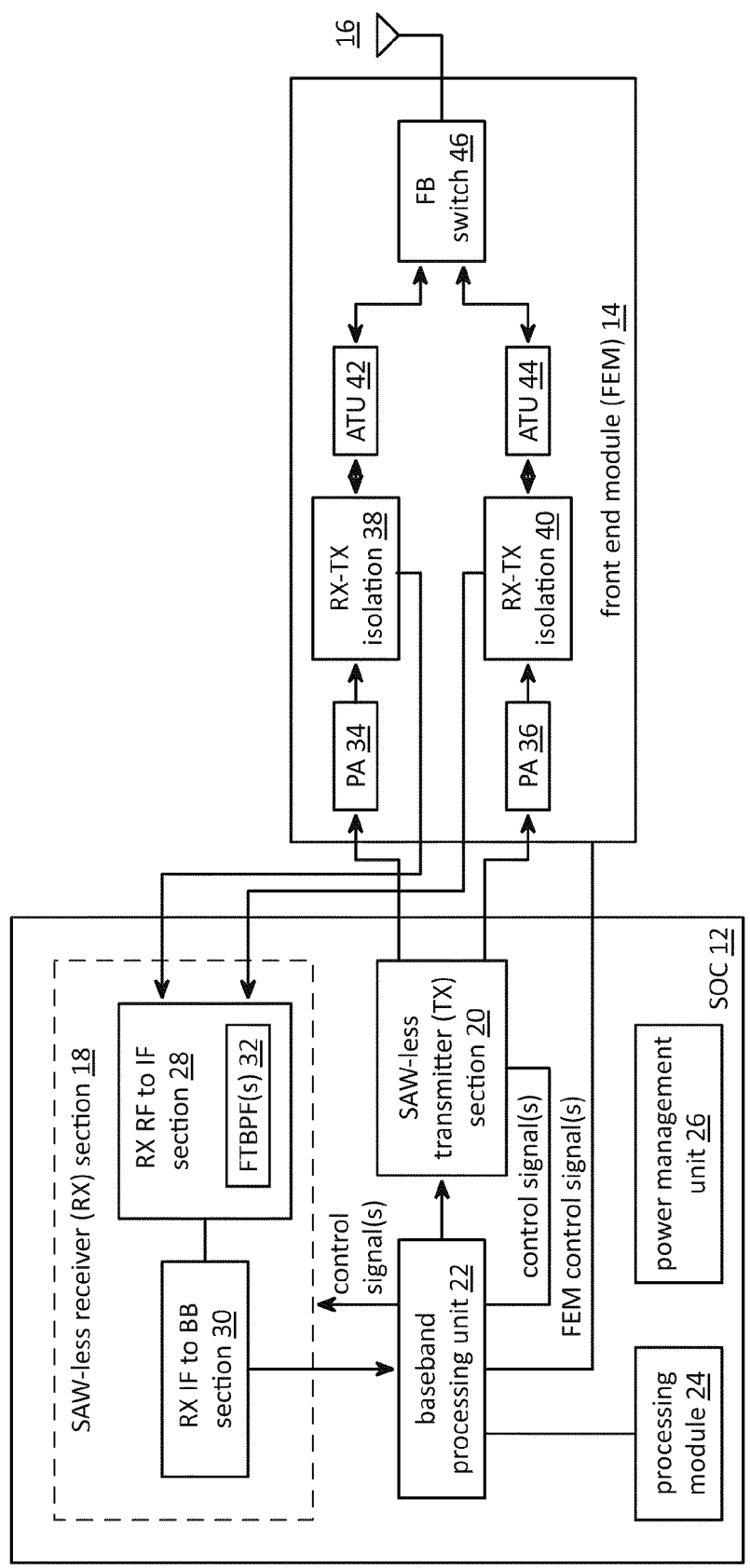
FIG. 2 is a schematic block diagram of an embodiment of a portable computing communication device in accordance with the present invention.

FIG. 2 is a schematic block diagram of an embodiment of a portable computing communication device 10 that includes a system on a chip (SOC) 12 and a front-end module (FEM) 14. The portable computing communication device 10 may be any device that can be carried by a person, can be at least partially powered by a battery, includes a radio transceiver (e.g., radio frequency (RF) and/or millimeter wave (MMW)) and performs one or more software applications. For example, the portable computing communication device 10 may be a cellular telephone, a laptop computer, a personal digital assistant, a video game console, a video game player, a personal entertainment unit, a tablet computer, etc.

The SOC 12 includes a SAW-less receiver section 18, a SAW-less transmitter section 20, a baseband processing unit 22, a processing module 24, and a power management unit 26. The SAW-less receiver 18 includes a receiver (RX) radio frequency (RF) to intermediate frequency (IF) section 28 and a receiver (RX) IF to baseband (BB) section 30. The RX RF to IF section 28 further includes one or more frequency translated bandpass filters (FTBPF) 32.

The processing module 24 and the baseband processing unit 22 may be a single processing device, separate processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module 24 and/or baseband processing unit 22 may have an associated memory and/or memory element, which may be a single memory device, a plurality of memory devices, and/or embedded circuitry of the processing module 24. Such a memory device may be a read-only memory, random access memory, volatile memory, non-volatile memory, static memory, dynamic memory, flash memory, cache memory, and/or any device that stores digital information. Note that if the processing module 24 and/or baseband processing unit 22 includes more than one processing device, the processing devices may be centrally located (e.g., directly coupled together via a wired and/or wireless bus structure) or may be distributedly located (e.g., cloud computing via indirect coupling via a local area network and/or a wide area network). Further note that when the processing module 24 and/or baseband processing unit 22 implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element stores, and the processing module 24 and/or baseband processing unit 22 executes, hard coded and/or operational instructions corresponding to at least some of the steps and/or functions illustrated in one or more of the Figures.

The front-end module (FEM) 14 includes one or more of a plurality of power amplifiers (PA) 34-36, a plurality of receiver-transmitter (RX-TX) isolation modules 38-40, a plurality of antenna tuning units (ATU) 42-44, and a frequency band (FB) switch 46. Note that the FEM 14 may include more than two paths of PAs 34-36, RX-TX isolation modules 38-40, and ATUs 42-44 coupled to the FB switch 46. For example, the FEM 14 may include one path for 2G (second generation) cellular telephone service, another path for 3G (third generation) cellular telephone service, and a third path for wireless local area network (WLAN) service. Of course there a multitude of other example combinations of paths within the FEM 14 to support one or more wireless communication standards (e.g., IEEE 802.11, Bluetooth, global system for mobile communications (GSM), code division multiple access (CDMA), radio frequency identification (RFID), Enhanced Data rates for GSM Evolution (EDGE), General Packet Radio Service (GPRS), WCDMA, high-speed downlink packet access (HSDPA), high-speed uplink packet access (HSUPA), LTE (Long Term Evolution), WiMAX (worldwide interoperability for microwave access), and/or variations thereof).

In an example of operation, the processing module 24 is performing one or more functions that require wireless transmission of data. In this instance, the processing module 24 provides the outbound data (e.g., voice, text, audio, video, graphics, etc.) to the baseband processing module 22, which converts the outbound data into one or more outbound symbol streams in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion includes one or more of: scrambling, puncturing, encoding, interleaving, constellation mapping, modulation, frequency spreading, frequency hopping, beamforming, space-time-block encoding, space-frequency-block encoding, frequency to time domain conversion, and/or digital baseband to intermediate frequency conversion. Note that the processing module 24 converts the outbound data into a single outbound symbol stream for Single Input Single Output (SISO) communications and/or for Multiple Input Single Output (MISO) communications and converts the outbound data into multiple outbound symbol streams for Single Input Multiple Output (SIMO) and Multiple Input Multiple Output (MIMO) communications.

The baseband processing unit 22 provides the one or more outbound symbol streams to the SAW-less transmitter section 20, which converts the outbound symbol stream(s) into one or more outbound RF or MMW signals. The SAW-less transceiver section 20 may include a direct conversion topology (e.g., direct conversion of baseband or near baseband symbol streams to RF signals) or a super heterodyne topology (e.g., convert baseband or near baseband symbol streams into IF signals and then convert the IF signals into RF signals).

For a direction conversion, the SAW-less transmitter section 20 may have a Cartesian-based topology, a polar-based topology, or a hybrid polar-Cartesian-based topology. In a Cartesian-based topology, the SAW-less transmitter section 20 mixes in-phase and quadrature components (e.g., $A_I(t)\cos(\omega_{BB}(t)+\phi_I(t))$ and $A_Q(t)\cos(\omega_{BB}(t)+\phi_Q(t))$, respectively) of the one or more outbound symbol streams with in-phase and quadrature components (e.g., $\cos(\omega_{RF}(t))$ and $\sin(\omega_{RF}(t))$, respectively) of one or more transmit local oscillations (TX LO) to produce mixed signals. The mixed signals are combined and filtered to produce one or more outbound up-converted signals (e.g., $A(t)\cos(\omega_{BB}(t)+\phi(t)+\omega_{RF}(t))$). A power amplifier driver (PAD) module amplifies the outbound up-converted signal(s) to produce a pre-PA (power amplified) outbound RF signal(s).

In a phase polar-based topology, the SAW-less transmitter section 20 includes an oscillator that produces an oscillation (e.g., $\cos(\omega_{RF}(t))$ this is adjusted based on the phase information (e.g., $+/-\Delta\phi$[phase shift] and/or $\phi t$)[phase modulation]) of the outbound symbol stream(s). The resulting adjusted oscillation (e.g., $\cos(\omega_{RF}(t)+/-\Delta\phi)$ or $\cos(\omega_{RF}(t)+\phi(t))$) may be further adjusted by amplitude information (e.g., A(t) [amplitude modulation]) of the outbound symbol stream(s) to produce one or more up-converted signals (e.g., $A(t)\cos(\omega_{RF}(t)+\phi(t))$ or $A(t)\cos(\omega_{RF}(t)+/-\Delta\phi)$). A power amplifier driver (PAD) module amplifies the outbound up-converted signal(s) to produce a pre-PA (power amplified) outbound RF signal(s).

In a frequency polar-based topology, the SAW-less transmitter section 20 includes an oscillator that produces an oscillation (e.g., $\cos(\omega_{RF}(t))$ this is adjusted based on the frequency information (e.g., $+/-\Delta f$[frequency shift] and/or f(t)) [frequency modulation]) of the outbound symbol stream(s).

The resulting adjusted oscillation (e.g., $\cos(\omega_{RF}(t)+/-\Delta f)$ or $\cos(\omega_{RF}(t)+f(t))$) may be further adjusted by amplitude information (e.g., A(t)[amplitude modulation]) of the outbound symbol stream(s) to produce one or more up-converted signals (e.g., $A(t)\cos(\omega_{RF}(t)+f(t))$ or $A(t)\cos(\omega_{RF}(t)+/-\Delta f)$). A power amplifier driver (PAD) module amplifies the outbound up-converted signal(s) to produce a pre-PA (power amplified) outbound RF signal(s).

In a hybrid polar-Cartesian-based topology, the SAW-less transmitter section 20 separates the phase information (e.g., $\cos(\omega_{BB}(t)+/-\Delta\phi)$ or $\cos(\omega_{BB}(t)+\phi(t))$) and the amplitude information (e.g., A(t)) of the outbound symbol stream(s). The SAW-less transmitter section 20 mixes in-phase and quadrature components (e.g., $\cos(\omega_{BB}(t)+\phi_I(t))$ and $\cos(\omega_{BB}(t)+\phi_Q(t))$, respectively) of the one or more outbound symbol streams with in-phase and quadrature components (e.g., $\cos(\omega_{RF}(t))$ and $\sin(\omega_{RF}(t))$, respectively) of one or more transmit local oscillations (TX LO) to produce mixed signals. The mixed signals are combined and filtered to produce one or more normalized outbound up-converted signals (e.g., $\cos(\omega_{BB}(t)+\phi(t))+\omega_{RF}(t))$). A power amplifier driver (PAD) module amplifies the normalized outbound up-converted signal(s) and injects the amplitude information (e.g., A(t)) into the normalized outbound up-converted signal(s) to produce a pre-PA (power amplified) outbound RF signal(s) (e.g., $A(t)\cos(\omega_{RF}(t)+\phi(t))$).

For a super heterodyne topology, the SAW-less transmitter section 20 includes a baseband (BB) to intermediate frequency (IF) section and an IF to a radio frequency (RF) section). The BB to IF section may be of a polar-based topology, a Cartesian-based topology, a hybrid polar-Cartesian-based topology, or a mixing stage to up-convert the outbound symbol stream(s). In the three former cases, the BB to IF section generates an IF signal(s) (e.g., $A(t)\cos(\omega_{IF}(t)+\phi(t))$) and the IF to RF section includes a mixing stage, a filtering stage and the power amplifier driver (PAD) to produce the pre-PA outbound RF signal(s).

When the BB to IF section includes a mixing stage, the IF to RF section may have a polar-based topology, a Cartesian-based topology, or a hybrid polar-Cartesian-based topology. In this instance, the BB to IF section converts the outbound symbol stream(s) (e.g., $A(t)\cos((\omega_{BB}(t)+\phi(t)))$) into intermediate frequency symbol stream(s) (e.g., A(t) $(\omega_{IF}(t)+\phi(t))$). The IF to RF section converts the IF symbol stream(s) into the pre-PA outbound RF signal(s).

The SAW-less transmitter section 20 outputs the pre-PA outbound RF signal(s) to a power amplifier module (PA) 34-36 of the front-end module (FEM) 14. The PA 34-36 includes one or more power amplifiers coupled in series and/or in parallel to amplified the pre-PA outbound RF signal(s) to produce an outbound RF signal(s). Note that parameters (e.g., gain, linearity, bandwidth, efficiency, noise, output dynamic range, slew rate, rise rate, settling time, overshoot, stability factor, etc.) of the PA 34-36 may be adjusted based on control signals received from the baseband processing unit 22 and/or the processing module 24. For instance, as transmission conditions change (e.g., channel response changes, distance between TX unit and RX unit changes, antenna properties change, etc.), the processing resources (e.g., the BB processing unit 22 and/or the processing module 24) of the SOC 12 monitors the transmission condition changes and adjusts the properties of the PA 34-36 to optimize performance. Such a determination typically is not made in isolation; it is done in light to other parameters of the front-end module that may be adjusted (e.g., the ATU 42-44, the RX-TX isolation module 38-40) to optimize transmission and reception of the RF signals.

The RX-TX isolation module 38-40 (which may include a balancing network and a duplexer, a circulator, a transformer balun, or other device that provides isolation between a TX signal and an RX signal using a common antenna) attenuates the outbound RF signal(s). The RX-TX isolation module 38-40 may adjusts it attenuation of the outbound RF signal(s) (i.e., the TX signal) based on control signals received from the baseband processing unit and/or the processing module 24 of the SOC 12. For example, when the transmission power is relatively low, the RX-TX isolation module 38-40 may be adjusted to reduce its attenuation of the TX signal.

The antenna tuning unit (ATU) 42-44, if included, is tuned to provide a desired impedance that substantially matches that of the antenna 16. As tuned, the ATU 42-44 provides the attenuated TX signal from the RX-TX isolation module 38-40 to the antenna 16 for transmission. Note that the ATU 42-44 may be continually or periodically adjusted to track impedance changes of the antenna 16. For example, the baseband processing unit 22 and/or the processing module 24 may detect a change in the impedance of the antenna 16 and, based on the detected change, provide control signals to the ATU 42-44 such that it changes it impedance accordingly.

In this example, the SAW-less transmitter 20 section has two outputs: one for a first frequency band and the other for a second frequency band. The preceding discussion has focused on the process of converting outbound data into outbound RF signals for a single frequency band (e.g., 850 MHz, 900 MHz, etc.). The process is similar for converting outbound data into RF signals for the other frequency band (e.g., 1800 MHz, 1900 MHz, 2100 MHz, 2.4 GHz, 5 GHz, etc.). Note that with a single antenna 16, the SAW-less transmitter 20 generates outbound RF signals in one of the other frequency bands. The frequency band (FB) switch 46 of the FEM 14 couples the antenna 16 to the appropriate output of the SAW-less transmitter output path. The FB switch 46 receives control information from the baseband processing unit 22 and/or the processing module 24 to select which path to connect to the antenna 16.

The antenna 16 also receives one or more inbound RF signals, which are provided to one of the ATUs 42-44 via the frequency band (FB) switch 46. The ATU 42-44 provides the inbound RF signal(s) to the RX-TX isolation module 38-40, which routes the signal(s) to the receiver (RX) RF to IF section 28 of the SOC 12. The RX RF to IF section 28 converts the inbound RF signal(s) (e.g., $A(t)\cos(\omega_{RF}(t)+\phi(t))$) into an inbound IF signal (e.g., $A_I(t)\cos(\omega_{IF}(t)+\phi_I(t))$ and $A_Q(t)\cos(\omega_{IF}(t)+\phi_Q(t))$). Various embodiments of the RX RF to IF section 28 will be described in several of the subsequent figures.

The RX IF to BB section 30 converts the inbound IF signal into one or more inbound symbol streams (e.g., $A(t)\cos((\omega_{BB}(t)+\phi(t)))$. In this instance, the RX IF to BB section 30 includes a mixing section and a combining & filtering section. The mixing section mixes the inbound IF signal(s) with a second local oscillation (e.g., LO2=IF−BB, where BB may range from 0 Hz to a few MHz) to produce I and Q mixed signals. The combining & filtering section combines (e.g., adds the mixed signals together—which includes a sum component and a difference component) and then filters the combined signal to substantially attenuate the sum component and pass, substantially unattenuated, the difference component as the inbound symbol stream(s).

The baseband processing unit 22 converts the inbound symbol stream(s) into inbound data (e.g., voice, text, audio, video, graphics, etc.) in accordance with one or more wireless communication standards (e.g., GSM, CDMA, WCDMA, HSUPA, HSDPA, WiMAX, EDGE, GPRS, IEEE 802.11, Bluetooth, ZigBee, universal mobile telecommunications system (UMTS), long term evolution (LTE), IEEE 802.16, evolution data optimized (EV-DO), etc.). Such a conversion may include one or more of: digital intermediate frequency to baseband conversion, time to frequency domain conversion, space-time-block decoding, space-frequency-block decoding, demodulation, frequency spread decoding, frequency hopping decoding, beamforming decoding, constellation demapping, deinterleaving, decoding, depuncturing, and/or descrambling. Note that the processing module 24 converts a single inbound symbol stream into the inbound data for Single Input Single Output (SISO) communications and/or for Multiple Input Single Output (MISO) communications and converts the multiple inbound symbol streams into the inbound data for Single Input Multiple Output (SIMO) and Multiple Input Multiple Output (MIMO) communications.

The power management unit 26 is integrated into the SOC 12 to perform a variety of functions. Such functions include monitoring power connections and battery charges, charging a battery when necessary, controlling power to the other components of the SOC 12, generating supply voltages, shutting down unnecessary SOC modules, controlling sleep modes of the SOC modules, and/or providing a real-time clock. To facilitate the generation of power supply voltages, the power management unit 26 may includes one or more switch-mode power supplies and/or one or more linear regulators.

With such an implementation of a portable computing communication device 10, expensive and discrete off-chip components (e.g., SAW filters, duplexers, inductors, and/or capacitors) are eliminated and their functionality is incorporated in the front-end module (FEM) 14 that can be implemented on a single die. Further, the SAW-less receiver architecture and the SAW-less transmitter architecture facilitate the elimination of the discrete off-chip components.

Figure 3:
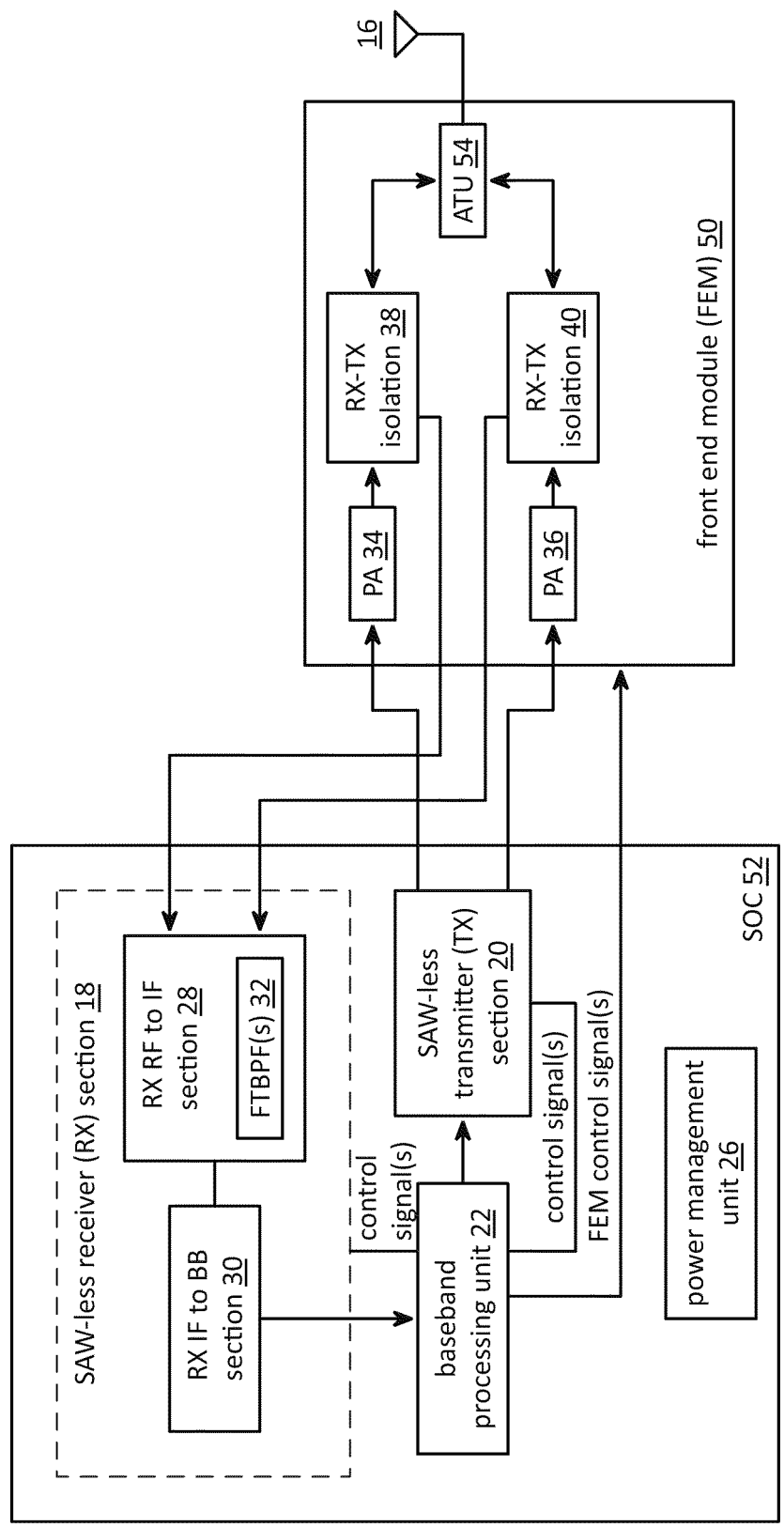
FIG. 3 is a schematic block diagram of another embodiment of a portable computing communication device in accordance with the present invention.

FIG. 3 is a schematic block diagram of another embodiment of a portable computing communication device 10 that includes a system on a chip (SOC) 52 and another embodiment of a front-end module (FEM) 50. The SOC 52 includes the power management unit 26, the SAW-less receiver section 18, the SAW-less transmitter section 20, the baseband processing unit 22, and may further include the processing module. The FEM 50 includes a plurality of power amplifier modules (PA) 34-36, a plurality of RX-TX isolation modules 38-40, and at least one antenna tuning unit (ATU) 54.

In this embodiment, the SOC 52 is operable to concurrently support two or more wireless communications (e.g., a cellular telephone call and a WLAN communication and/or a Bluetooth communication). In this instance, the SAW-less transmitter 20 generates two (or more) different frequency band outbound RF signals in a manner discussed with reference to FIG. 2 and/or with reference to one or more subsequent figures. A first one of the different frequency outbound RF signals is provided to one of the PAs 34-36 of the FEM 50 and the other outbound RF signal is provided to the other PA 34-36. Each of the TX-RX isolation modules 38-40 functions as described with reference to FIG. 2 and as may be described with reference to one or more of the subsequent figures. The ATU 54, which is tuned based on control signals from the SOC 52, provides the two outbound RF signals to the antenna 16 for transmission.

The antenna 16 also receives two or more different frequency band inbound RF signals, which it provides to the ATU 54. The ATU 54 may includes a splitter to separate the two inbound RF signals and separate impedance matching circuits (e.g., one or more LC circuits) for each separated signal; a transformer balun to separate the signals and separate impedance matching circuits; or an impedance matching circuits for the two signals, which are provided to the RX-TX isolation modules 38-40.

The RX-TX isolation modules 38-40 are each frequency band dependent such that each will only pass inbound and outbound RF signals within their respective frequency bands (e.g., 850-900 MHz and 1800-1900 MHz). As such, a first TX-RX isolation module 38-40 provides a first frequency band inbound RF signal to a first input of the SAW-less RX section 18 and the second TX-RX isolation module 38-40 provides the second frequency band inbound RF signal to a second input of the SAW-less RX section 18. The SAW-less RX section 18 processes the inbound RF signals to produce first inbound data and second inbound data in manner as discussed with reference to FIG. 2 and/or as will be discussed with reference to one or more of the subsequent figures.

Figure 4:
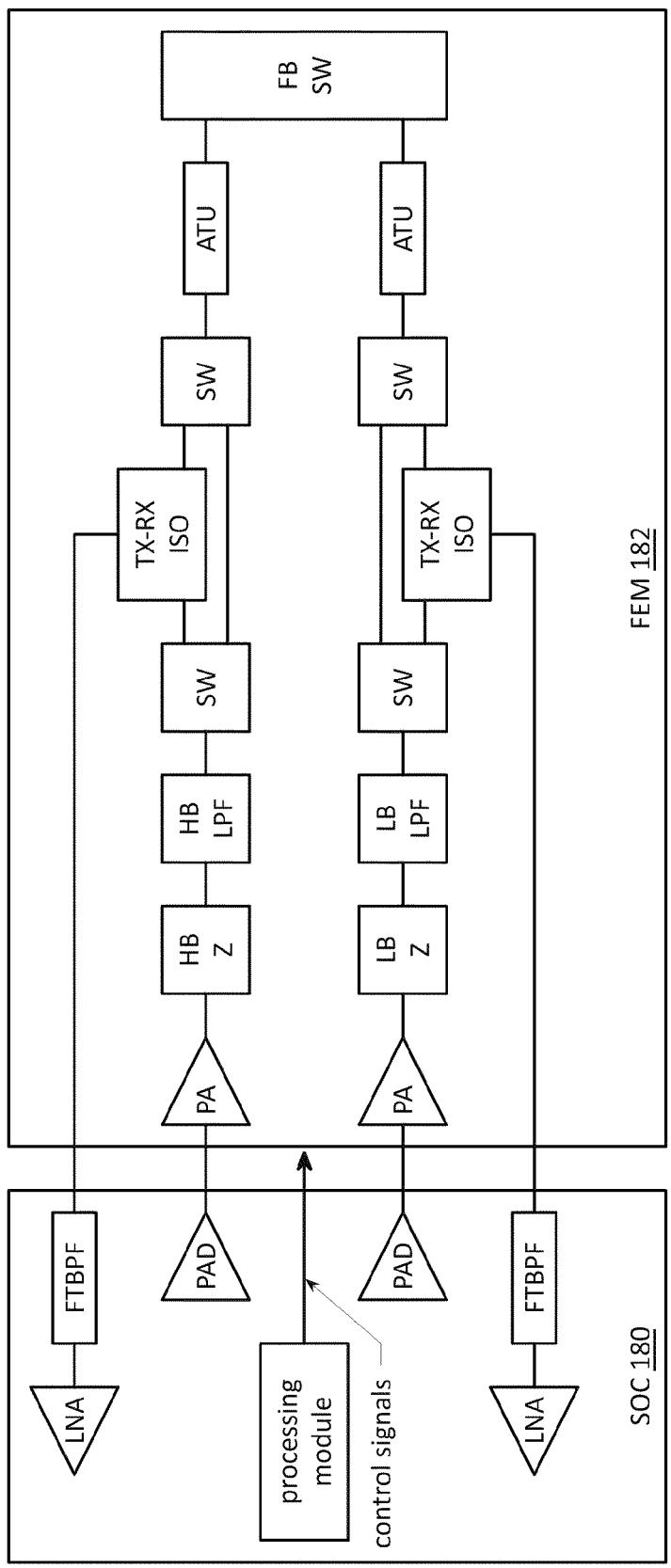
FIG. 4 is a schematic block diagram of another embodiment of a portable computing communication device in accordance with the present invention.

FIG. 4 is a schematic block diagram of another embodiment of a portable computing communication device that includes a system on a chip (SOC) 180 coupled to a front-end module (FEM) 182. The SOC 180 includes a plurality of SAW-less receiver sections (only the LNA and frequency translated bandpass filter (FTBPF) of the receiver section are shown), a plurality of SAW-less transmitter sections (only the power amplifier driver (PAD) are shown), the processing module, the baseband processing module (not shown or included in the processing module), and the power management unit (not shown).

The FEM 182 includes a low frequency band (LB) path, a high frequency band (HB) path, and a frequency band switch (FB SW). The LB path includes a power amplifier module (PA), a low band impedance stage (LB Z), a low band low pass filter (LB LPF), a switch (SW), a transmit-receive isolation module (TX-RX ISO) (e.g., a duplexer), a second switch (SW), and an antenna tuning unit (ATU). The HB path includes a power amplifier module (PA), a high band impedance stage (HB Z), a high band low pass filter (HB LPF), a switch (SW), a transmit-receive isolation module (TX-RX ISO) (e.g., a duplexer), a second switch (SW), and an antenna tuning unit (ATU). Note that the low band path may be used to support low band GSM, EDGE, and/or WCDMA wireless communications and the high band path may be used to support high band GSM, EDGE, and/or WCDMA wireless communications.

The SOC 180 functions to output pre-PA outbound RF signals and to input inbound RF signals as previously discussed and/or as will be discussed with reference to one or more of the subsequent figures. The FEM 182 receives the pre-PA outbound RF signals via the LB path or the HB path and amplifies them via the corresponding PA module. The impedance stage (LB Z or HB Z) provides a desired load on the output of the PA modules and is coupled to the low pass filter (LB LPF or HP LPF). The LPF filters the outbound RF signal, which is provided to the TX-RX ISO module or to the ATU depending on the configuration of the switches (SW). If switches couple the LPF to the TX-RX ISO module, the TX-RX module attenuates the outbound RF signals before providing them to the ATU. The ATU functions as previously described and/or as will be described with reference to one or more of the subsequent figures.

Note that there are no discrete components between the SOC 180 and the FEM 182. In particular, the portable computing communication device does not need discrete SAW-filters as are required in current cellular telephone implementations. One or more of the architecture of the SAW-less receiver, the architecture of the SAW-less transmitter, and/or the programmability of the various components of the FEM 182 contribute to the elimination of SAW filters and/or other conventional external discrete components.

Figure 5:
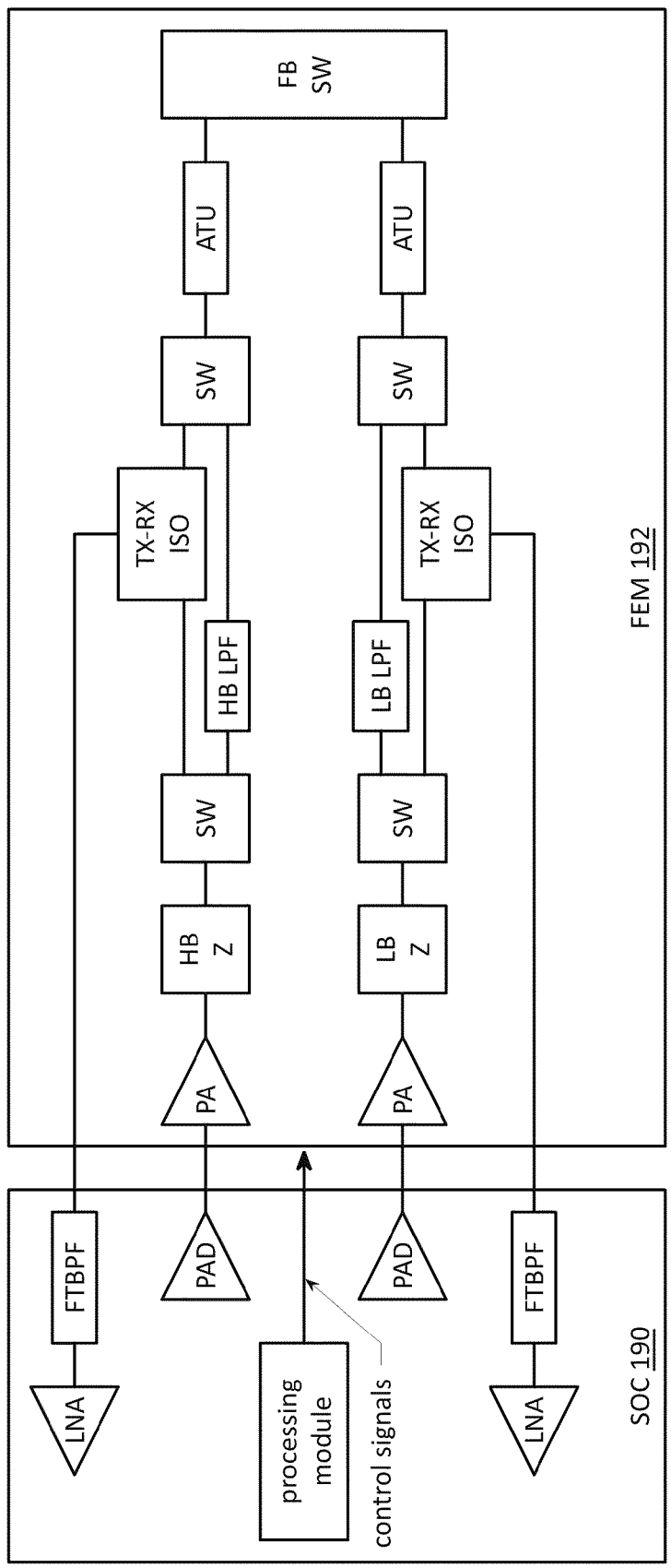
FIG. 5 is a schematic block diagram of another embodiment of a portable computing communication device in accordance with the present invention.

FIG. 5 is a schematic block diagram of another embodiment of a portable computing communication device that includes a system on a chip (SOC) 190 coupled to a front-end module (FEM) 192. The SOC 190 includes a plurality of SAW-less receiver sections (only the LNA and frequency translated bandpass filter (FTBPF) of the receiver section is shown), a plurality of SAW-less transmitter sections (only the power amplifier driver (PAD) is shown), the processing module, the baseband processing module (not shown or included in the processing module), and the power management unit (not shown).

The FEM 192 includes a low frequency band (LB) path, a high frequency band (HB) path, and a frequency band switch (FB SW). The LB path includes a power amplifier module (PA), a low band impedance stage (LB Z), a switch (SW), a low band low pass filter (LB LPF), a transmit-receive isolation module (TX-RX ISO) (e.g., a duplexer), a second switch (SW), and an antenna tuning unit (ATU). The HB path includes a power amplifier module (PA), a high band impedance stage (HB Z), a switch (SW), a high band low pass filter (HB LPF), a transmit-receive isolation module (TX-RX ISO) (e.g., a duplexer), a second switch (SW), and an antenna tuning unit (ATU). Note that the low band path may be used to support low band GSM, EDGE, and/or WCDMA wireless communications and the high band path may be used to support high band GSM, EDGE, and/or WCDMA wireless communications.

In the various embodiments of the SOC 190, the frequency translated bandpass filter in the receiver section of the SOC 190 sufficiently filters the far-out blockers and filters the image signal with negligible affect on the desired signal. This reduces the dynamic range requirement of the analog to digital converters (ADC) of the receiver section (at the output end of the baseband processing module or at the input of the RX BB to IF section). The super heterodyne architecture of the receiver section is optimal for reducing power consumption and die area in comparison to a comparable direction conversion receiver section.

Figure 6:
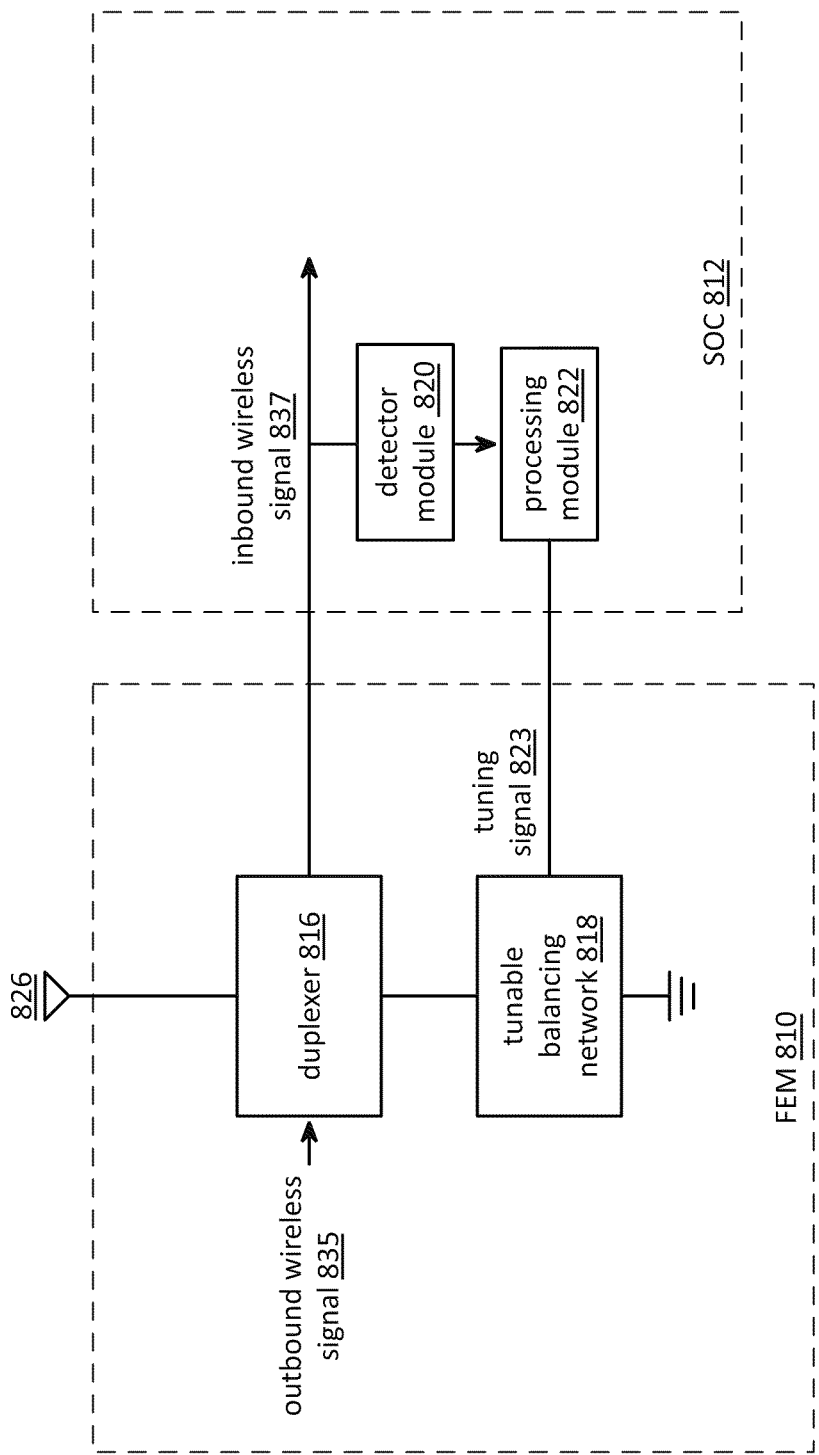
FIG. 6 is a schematic block diagram of an embodiment of a portion of each of a front-end module (FEM) and an SOC module in accordance with the present invention.

FIG. 6 is a schematic block diagram of a front end module 810 and a system-on-a-chip module 812. The front end module 810 includes a duplexer 816 and a tunable balancing network 818. The system on a chip module 812 includes a detector module 820 and a processing module 822. Note that, processing module 822, like any other processing module discussed in this application, may be constructed as described with reference to processing module 24 of FIG. 2.

In an example of operation, the duplexer is couple to an antenna 826 that transceivers inbound and outbound wireless signals 835 and 837. For example, the inbound and outbound wireless signals 835 & 837 may correspond to a radio frequency (RF) signals produced in accordance with one or more wireless communication protocols of which examples have been previously provided. As a more specific example, the outbound wireless signal 835 has a carrier frequency that corresponds to a transmit frequency of a wireless communication protocol and the inbound wireless signal 835 has a carrier frequency that corresponds to a receive frequency band of the wireless indication protocol.

The duplexer 816 provides electrical isolation between the inbound wireless signal 837 and the outbound wireless signal 835. The duplexer 816 may be a frequency—selective duplexer or an electrical—balance duplexer to provide 30 dB or more of isolation between the inbound and outbound wireless signals 835 and 837.

The tunable balancing network 818 is operable to establish on impedance that substantially matches on an impedance of the antenna based on a tuning signal 823. In general, energy (e.g., current and/or voltage) of the outbound wireless signal 835 is divided into two paths. The first path is to the antenna 826 and the second path is to the tunable balancing network 818. If the paths are substantially equal, then the energy will be substantially equal, which effectively cancels out the outbound wireless signal 835 coupling into the inbound wireless signal 837 portion of duplex or 816.

To maintain the impedance balance of the tunable balancing network 818 with the changing impedance of the antenna 826, the detector module 820 monitors an electrical performance characteristic of the duplexer 816. For example, the detector module 820 monitors a common mode of the duplexer 816 to detect for a common mode offset due to impedance imbalance between the antenna and tunable balancing network 818. If an offset is detected, the detector module 820 generates an error signaled. Note that other electrical performance characteristics include, but are not limited to, impedance mismatches within the duplexer, nonlinearity of one or more components of the duplexer, and/or frequency dependent component responses.

The processing module 822, functioning as a tuning engine, generates the tuning signal 823 based on the error signal. For example, the error signal may indicate that the impedance of the tunable balancing network 818 is less than the impedance of the antenna 826. In this instance, the processing module generates the tuning signal 823 to increase the impedance of the tunable balancing network 818 to more closely match the antenna's impedance. Note that this is a dynamic process as the impedance of the antenna changes based on environmental conditions such as proximity to metal objects, multipath fading, etc.

Figure 7:
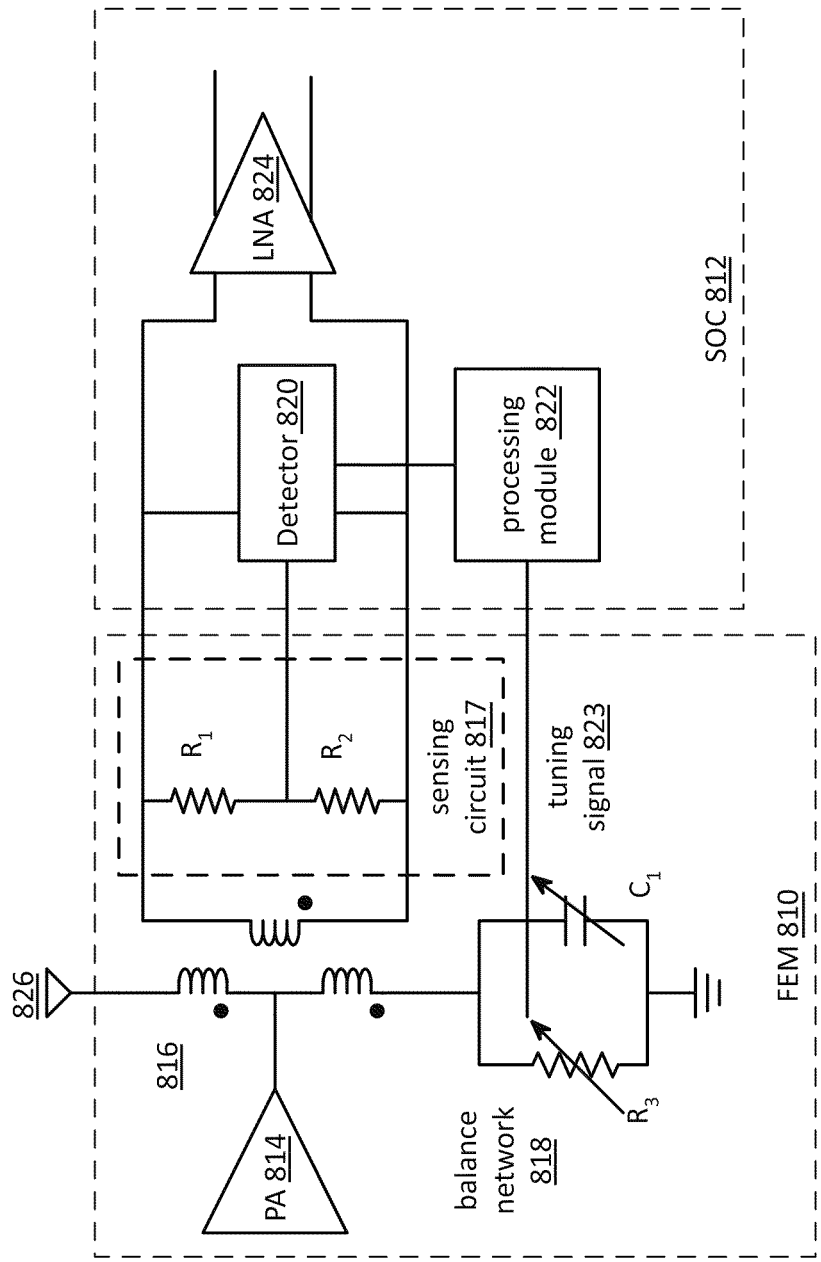
FIG. 7 is a schematic block diagram of an embodiment of a portion of each of a front-end module (FEM) and an SOC module in accordance with the present invention.

FIG. 7 is a schematic block diagram of an embodiment of a portion of each of a front-end module (FEM) 810 and an SOC 812. The portion of the FEM 810 includes a power amplifier module (PA) 814, a duplexer 816, a balance network 818, and a sensing circuit 817. The duplexer includes a transformer (or other structure such as a frequency selective duplexer and/or an electrical balance duplexer) and the balancing network 818 includes at least one of a tunable resistor-capacitor network, a tunable inductor-capacitor network, and a tunable resistor-inductor-capacitor network. The sensing circuit 817, to sense the electrical performance characteristic of the duplexer, includes a pair of resistors coupled across the secondary winding of the transformer. The portion of the SOC 812 includes a peak detector 820, a tuning engine 822, and a low noise amplifier module (LNA). Alternatively, the peak detector 820 and/or the tuning engine 822 may be within the FEM 810.

In an example of operation, the PA 814 supplies an outbound RF signal to the center tap of the dual winding primary of the transformer duplexer 816. Current of the outbound RF signal is split between the two windings proportional to the difference in impedance between the antenna and the balancing network 818. If the impedance of the balancing network 818 substantially matches the impedance of the antenna, the current is essentially equally split between the two windings.

With the winding configuration as shown, if the currents in the primary windings substantially match, their magnetic fields essential cancel each other in the secondary winding. Thus, the secondary has a substantially attenuated representation of the outbound RF signal. For an inbound RF signal, the two windings of the primary generate a magnetic field corresponding to the current of the inbound RF signal. In this instance, the magnetic fields are added, thus producing twice the current in the secondary than in the primary (assuming each of the windings has the same number of turns). As such, the transformer amplifies the inbound RF signal.

If there is an imbalance between the impedance of the antenna and the impedance of the balancing network 818, an outbound RF signal current component will be present in the secondary (e.g., TX leakage). For example, assume that the current through the winding to the inductor is $i_{P1}$ and the current through the winding to the balance network 818 is $i_{P2}$. The TX leakage can be expressed as $i_{P1}-i_{P2}$. The resistors of the common mode sensing circuit sense the TX leakage as an electrical performance characteristic of the duplexer. For instance, the voltage at the center node of the resistors equals $VS-(R_1*2i_R+R_1*i_{P2}-R_2*i_{P1})$, where VS is the voltage of the secondary and $2i_R$ is the current from the received inbound RF signal. Assuming $R_1=R_2$ and $i_{P1}=i_{P2}$, then the voltage at the center node equals ½ of VS. If, however, $i_{P1}$ does not equal $i_{P2}$, the voltage at the center node of the resistors will deviate from ½ VS proportionally to the difference. Note that the detector 820 outputs a voltage that is insensitive to a blocking signal being received by the antenna since the detector's inputs are coupled to the differential input of the LNA.

The detector 820 detects the difference of the voltage at the center node of the resistors from ½ VS and provides an indication of the difference to the processing module 822. The processing module 822, functioning as a tuning engine, interprets the difference and generates a control signal to adjust the impedance of the balance network. For example, if $i_{P1}$ is greater than $i_{P2}$, then the common mode voltage of the sensing circuit (e.g., the center node of the resistors) will be greater than ½ VS, which indicates that the impedance of the balance network 818 is too high. As such, the processing module 822 generates a tuning signal 823 that reduces the impedance of the balance network 818. As another example, if $i_{P1}$ is less than $i_{P2}$, then the common mode voltage of the sensing circuit will be less than ½ VS, which indicates that the impedance of the balance network is too low. As such, the processing module 822 generates a tuning signal 823 that increases the impedance of the balance network 818.

The processing module 822 may interpret the common mode voltage deviation, determine a desired impedance for the balance network 818, and generate a tuning signal accordingly. Alternatively, the processing module 822 may iteratively generate tuning signals that adjust the impedance of the balancing network 818 in steps until the desired impedance is achieved. With either approach, the processing module 822 functions to keep the impedance of the balance network 818 substantially matching the impedance of the antenna (which varies over time, use, and/or environmental conditions) to minimize TX leakage.

Figure 8:
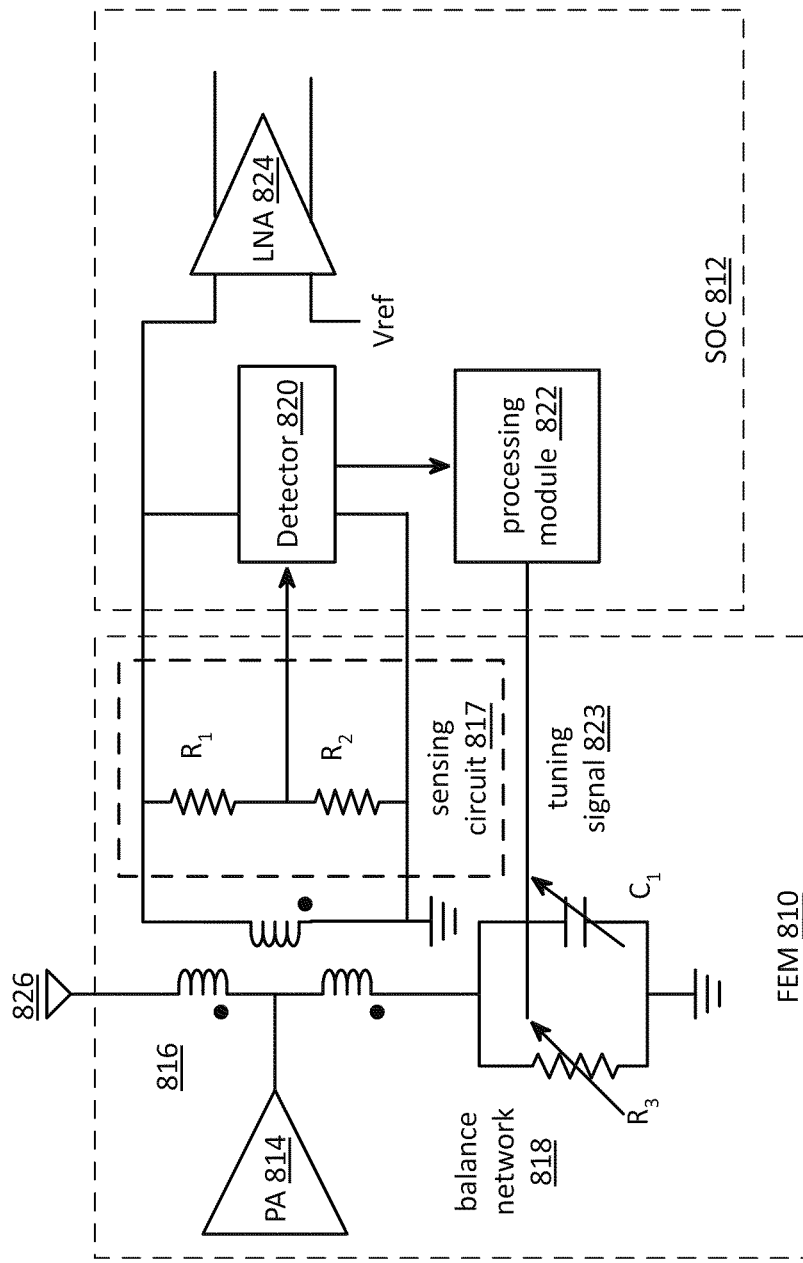
FIG. 8 is a schematic block diagram of another embodiment of a portion of each of a front-end module (FEM) and an LNA in accordance with the present invention.

FIG. 8 is a schematic block diagram of another embodiment of a portion of each of a front-end module (FEM) 960 and an SOC 962. The portion of the FEM 960 includes a power amplifier module (PA) 814, a duplexer 816, a balance network 818, and a sensing circuit 817. The duplexer 816 includes a transformer (or other structure such as a frequency selective duplexer and/or an electrical balance duplexer). The sensing circuit 817 includes a pair of resistors coupled across the secondary of the transformer. The portion of the SOC 962 includes a peak detector 974, a processing module 976 (which performs the function of the tuning engine), and a single-ended low noise amplifier module (LNA 972). Alternatively, the peak detector 974 and/or the tuning engine may be within the FEM 960.

The circuits compensate for the TX leakage as discussed with reference to FIG. 7. To further reduce common mode issues regarding processing the inbound wireless signal, the low noise amplifier 824 may be a single ended LNA. In this instance, one end of the secondary winding of the duplexer 816 is coupled to a common return and a second input of the low noise amplifier is coupled to a voltage reference.

Figure 9:
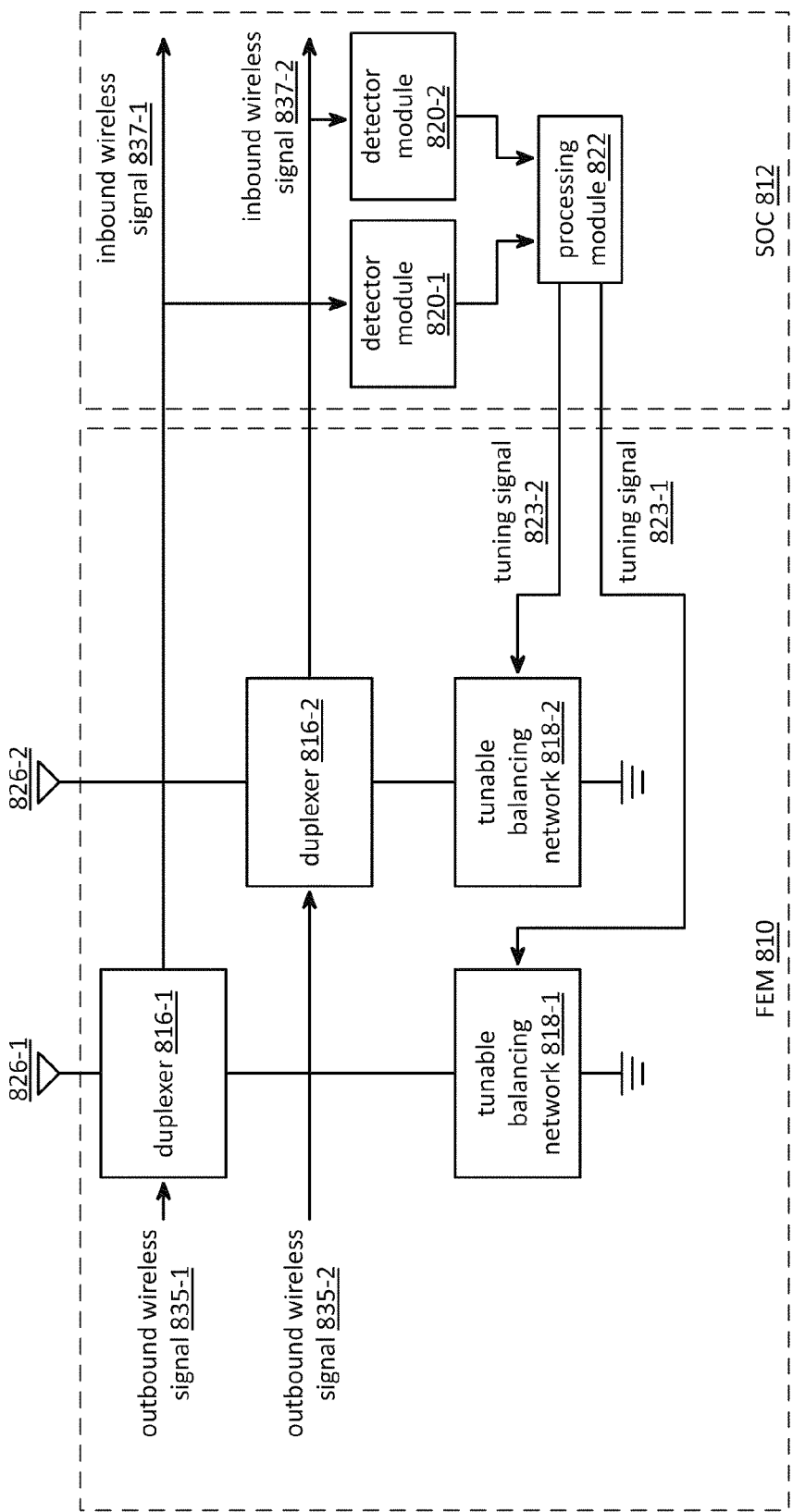
FIG. 9 is a schematic block diagram of another embodiment of a portion of each of a front-end module (FEM) and an SOC module in accordance with the present invention.

FIG. 9 is a schematic block diagram of an embodiment of a portion of each of a front-end module (FEM) 810 and an SOC 812. The front end module 810 includes a plurality of duplexer's 816-1 through 816-2 and a plurality of tunable balancing networks 818-1 through 818-2. Each of the duplexers 816 is coupled to an antenna 826-1 through 826-2. The system-on-a-chip module 812 includes the processing module 822 and a plurality of detector modules 820-1 through 820-2.

Duplexer 816-1 isolates the first outbound wireless signal 835-1 from a first inbound wireless signal 837-1. The first tunable balancing network 818-1 is tuned via the processing module 822 and a first detector module 820-1 as previously discussed. Similarly, duplexer 816-2 isolates a second outbound wireless signal 835-2 from a second inbound wireless signal 837-2. The second tunable balancing network 818-2 is tuned via a second tuning signal 823-2 by the processing module 822 and the second detection module 820-2.

In this embodiment, the first inbound and outbound wireless signals may be transceived in a first frequency band and the second inbound and outbound wireless signals may be transceived in a second frequency band. For example, each of the first and second frequency bands may be different ones of the 900 MHz frequency band, the 1800 MHz frequency band, the 1900 MHz frequency band, the 2 GHz frequency band, the 2.4 GHz frequency band, the 5 GHz frequency band, the 60 GHz frequency band, etc.

Figure 10:
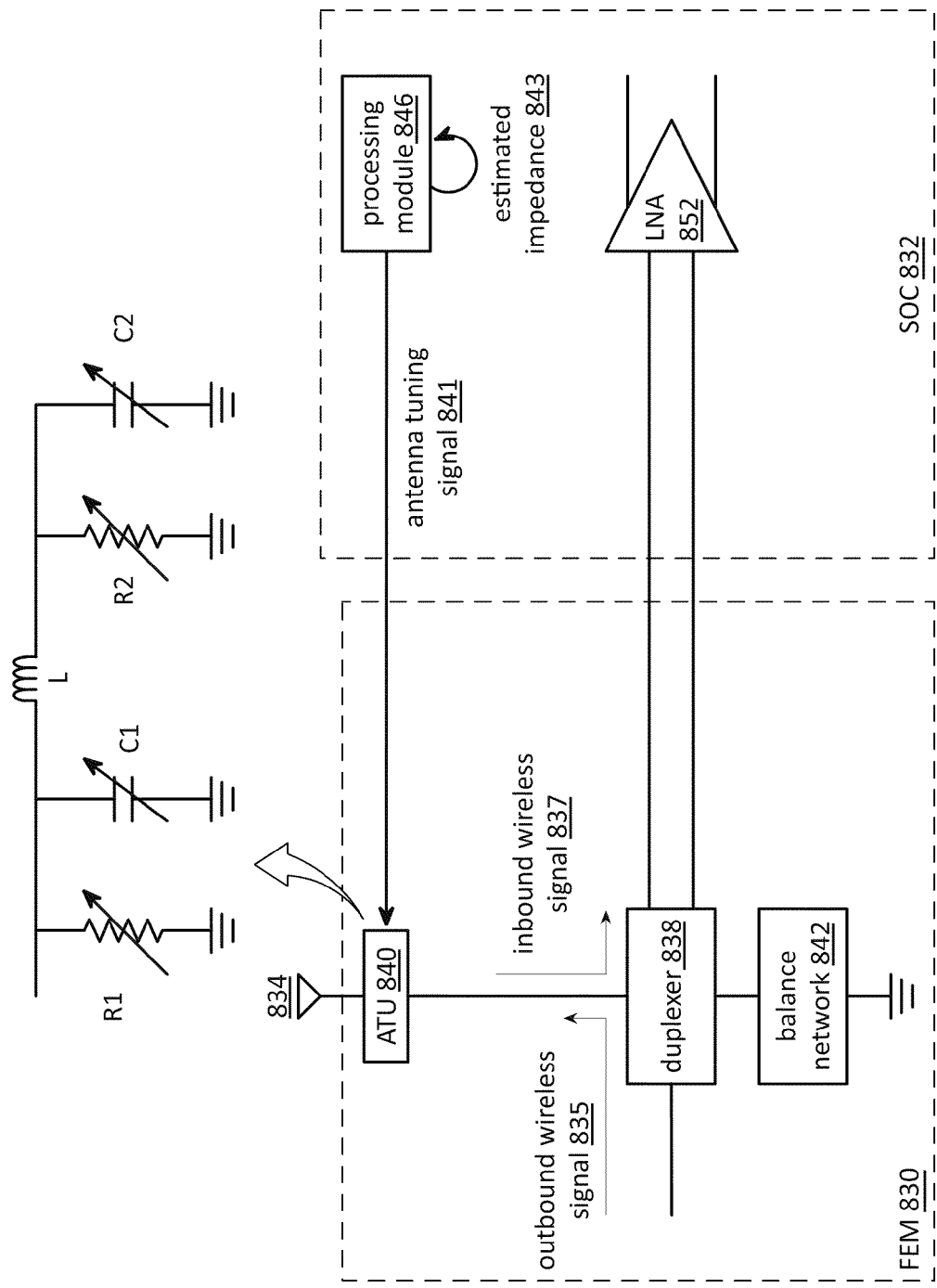
FIG. 10 is a schematic block diagram of another embodiment of a portion of each of a front-end module (FEM) and an SOC module in accordance with the present invention.

FIG. 10 is a schematic block diagram of an embodiment of a portion of each of a front-end module (FEM) 810 and an SOC 812. A front end module 830 includes a duplexer 838, a balance network, 842 and an antenna tuning unit (ATU) 840. The system-on-a-chip module 832 includes a low noise amplifier 852 and a processing module 846. The antenna tuning unit 840 may include a cascading resister-capacitor-inductor circuit as shown. The duplexer 838 and the balance network 842 may include components and function similarly to duplexers and balancing networks discussed throughout this detailed discussion.

In an example of operation, the antenna 834 receives an inbound wireless signal 837 from another communication device and transmits an outbound wireless signal 835. The inbound wireless signal 837 may be received from another wireless communication device in accordance with one or more wireless communication protocols. The outbound wireless signal 835 may be generated by a baseband processing, up conversion, and power amplification in the front end module 830 and/or in the system-on-a-chip module 832.

To provide optimal antenna performance, the antenna tuning unit 840 tunes an operational characteristic of the antenna (e.g., impedance, bandwidth, gain, quality factor, radiation pattern, polarization, efficiency, etc.) based on an antenna tuning signal. For example, the antenna tuning unit 840 adjusts a variable resistance and/or a variable capacitance of the cascaded resistor-capacitor-inductor network in accordance with the antenna tuning signal.

To produce the antenna tuning signal 841, the processing module 846 generates a balance network tuning signal, which adjusts the balancing network to substantially achieve a balanced impedance between the antenna and the balancing network. With the impedance of the antenna and balancing network substantially matching, the processing module 846 estimates the impedance, and/or other characteristics, of the antenna based on the inbound wireless signal 837, a test signal(s), and/or components of the outbound wireless signal 835 received by the low noise amplifier 852. For example, the antenna impedance may be estimated based on known properties of the inbound and/or outbound wireless signals and properties of the received inbound and/or outbound wireless signals. As a specific example, if the impedance is lower than expected (e.g., 50 Ohms), then the gain of the antenna is affected. By determining the gain affects, the impedance can be estimated.

Figure 11:
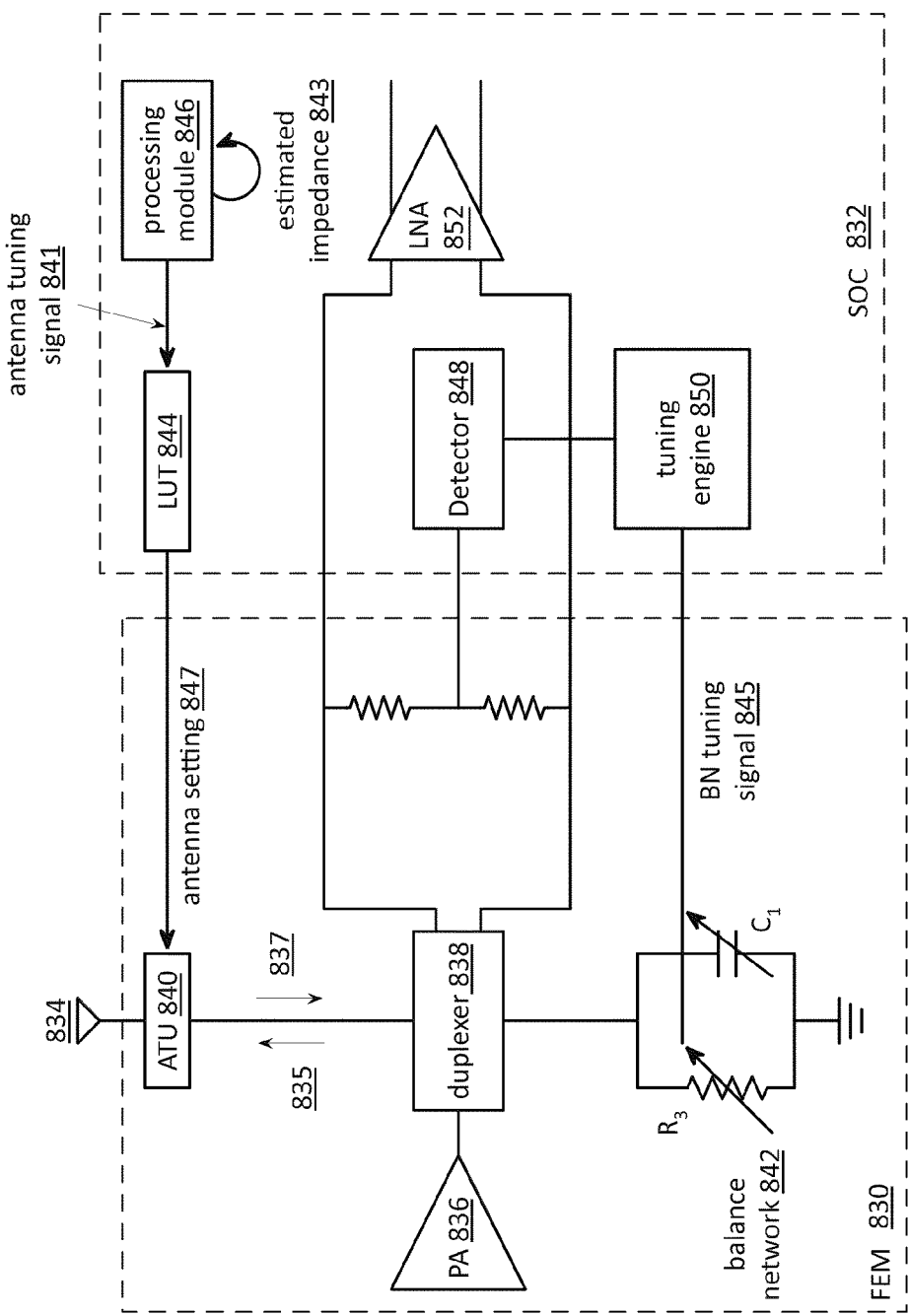
FIG. 11 is a schematic block diagram of another embodiment of a portion of each of a front-end module (FEM) and an SOC module in accordance with the present invention.

FIG. 11 is a schematic block diagram of another embodiment of a portion of each of a front-end module (FEM) 830 and an SOC 832. The portion of the FEM 830 includes a power amplifier module (PA) 836, a duplexer 838, a balance network 842, an antenna tuning unit (ATU) 840, and a common mode sensing circuit. The duplexer 838 includes a transformer (or other structure such as a frequency selective duplexer 838 and/or an electrical balance duplexer 838) and the balancing network includes at least a variable resistor and at least one variable capacitor. The common mode sensing circuit includes a pair of resistors coupled across the secondary of the transformer. The portion of the SOC 832 includes a peak detector 848, a tuning engine 850 (which may be implemented by the processing module 846), a look-up-table (LUT) 844, the processing module 846, and a low noise amplifier module (LNA) 852. Alternatively, the peak detector 848 and/or the tuning engine 850 may be within the FEM 830.

In addition to the functionality provided by the sensing circuit (i.e., the resistors), the detector 848, the tuning engine 850, and the balance network 842 to balance the impendence of the balance network 842 with the impedance of the antenna; the FEM 830 includes the ATU 840. The ATU 840 includes one or more fixed passive components and/or one or more variable passive components. For example, the ATU 840 may include a variable capacitor-inductor circuit, a variable capacitor, a variable inductor, etc. As another example, the ATU 840 may include a tunable resistor-capacitor-inductor network and a tunable capacitor-inductor network. Another example of the ATU 840 is provided in FIG. 10.

In an example of operation, the PA 836 provides an amplified outbound RF signal to the duplexer 838, which may include a transformer that functions to isolate the outbound RF signal from an inbound RF signal. The duplexer 838 outputs the amplified outbound RF signal to the ATU 840, which is tuned via settings stored in the LUT 844 to provide a desired antenna matching circuit (e.g., impedance, bandwidth, gain, quality factor, radiation pattern, frequency response, polarization, efficiency, etc.). To determine the setting to provide the ATU 840, the LUT 884 receives the antenna tuning signal 841 from the processing module 846. The LUT 884 then accesses an antenna setting 847 based on the antenna tuning signal and provides it to the ATU. The ATU 840 outputs the outbound RF signal to the antenna for transmission.

For an inbound RF signal, the antenna receives the signal and provides it to the ATU 840, which, in turn, provides it to the duplexer 838. The duplexer 838 outputs the inbound RF signal to the LNA 852 and the common mode sensing circuit. The common mode sensing circuit, the detector 848, the tuning engine 850, and the balance network 842 functions as previously described to balance the impedance of the balance network 842 with the impedance of the antenna.

The processing module 846 is operable to monitor various parameters of the FEM 830. For instance, the processing module 846 may monitor the antenna impedance, the transmit power, the performance of the PA 836 (e.g., gain, linearity, bandwidth, efficiency, noise, output dynamic range, slew rate, rise rate, settling time, overshoot, stability factor, etc.), received signal strength, SNR, SIR, adjustments made by the tuning engine 850, etc. The processing module 846 interprets the parameters to determine if performance of the FEM 830 may be further optimized. For example, the processing module 846 may determine that an adjustment to the ATU 840 will improve PA 836 performance. In this case, the processing module 846 addresses the LUT 844 to provide a desired setting to the ATU 840. If this change in the ATU 840 affects the impedance balance between the ATU 840 and the balance network 842, the tuning engine 850 makes an appropriate adjustment.

In an alternate embodiment, the processing module 846 provides the functionality of the tuning engine 850 and balances adjustments to the ATU 840 and to the balance network 842 to achieved a desired performance of the FEM 830. In yet another alternate embodiment, the balance network 842 is fixed and the ATU 840 provides the desired adjusts in the FEM 830 to achieve impedance balance and to achieve the desired performance of the FEM 830.

Figure 12:
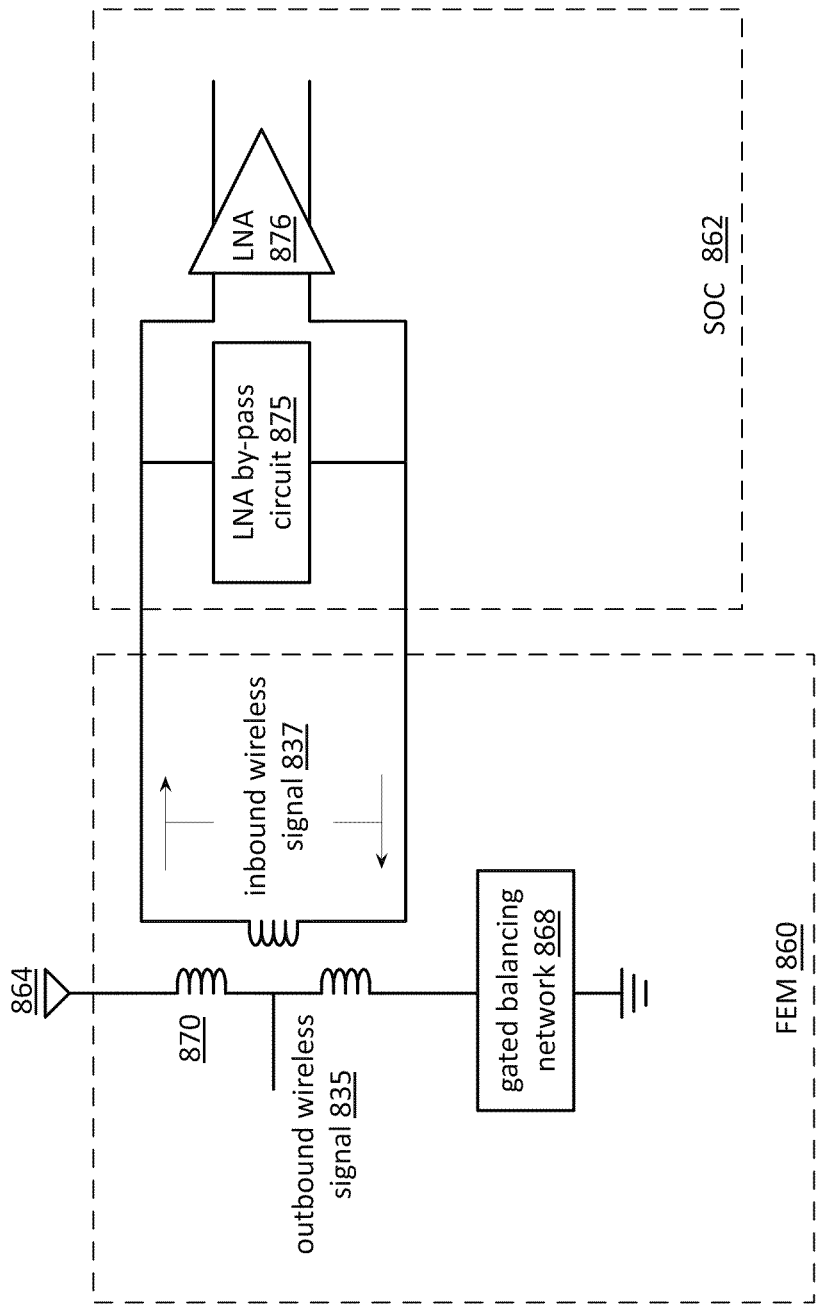
FIG. 12 is a schematic block diagram of another embodiment of a portion of each of a front-end module (FEM) and an SOC module in accordance with the present invention.

FIG. 12 is a schematic block diagram of another embodiment of a portion of each of a front-end module (FEM) 860 and an SOC 862. The front end module 860 includes a duplexer 870 and a gated balancing network 868. The system-on-a-chip module 862 includes a low noise amplifier 876 and an LNA by-pass circuit 875.

In an example of operation, the duplexer 870 provides electrical isolation between an outbound wireless signal 835 and an inbound wireless signal 837 that are transceived via the antenna 864. The gated balancing network 868 establishes an impedance that substantially matches an impedance of the antenna when the radio front end is in a third mode and establishes a low impedance with respect to the impedance of the antenna when the radio front end is in one of a first and second modes. For example, the first mode corresponds to a receive mode of the radio front end when the inbound wireless signal is in accordance with a time division duplex (TDD) protocol; the second mode corresponds to a transmit mode of the radio front end when the outbound wireless signal is in accordance with the TDD protocol; and the third mode corresponds to the radio front end transceiving the inbound and outbound wireless signals is in accordance a frequency division duplex (FDD) protocol.

The LNA by-pass circuit 875 passes the inbound wireless signal to the LNA when the radio front end is in a first mode and bypasses the LNA when the radio front end is in a second mode. The low noise amplifier (LNA) 876 amplifies the inbound wireless signal to produce an amplified inbound wireless signal.

Figure 13:
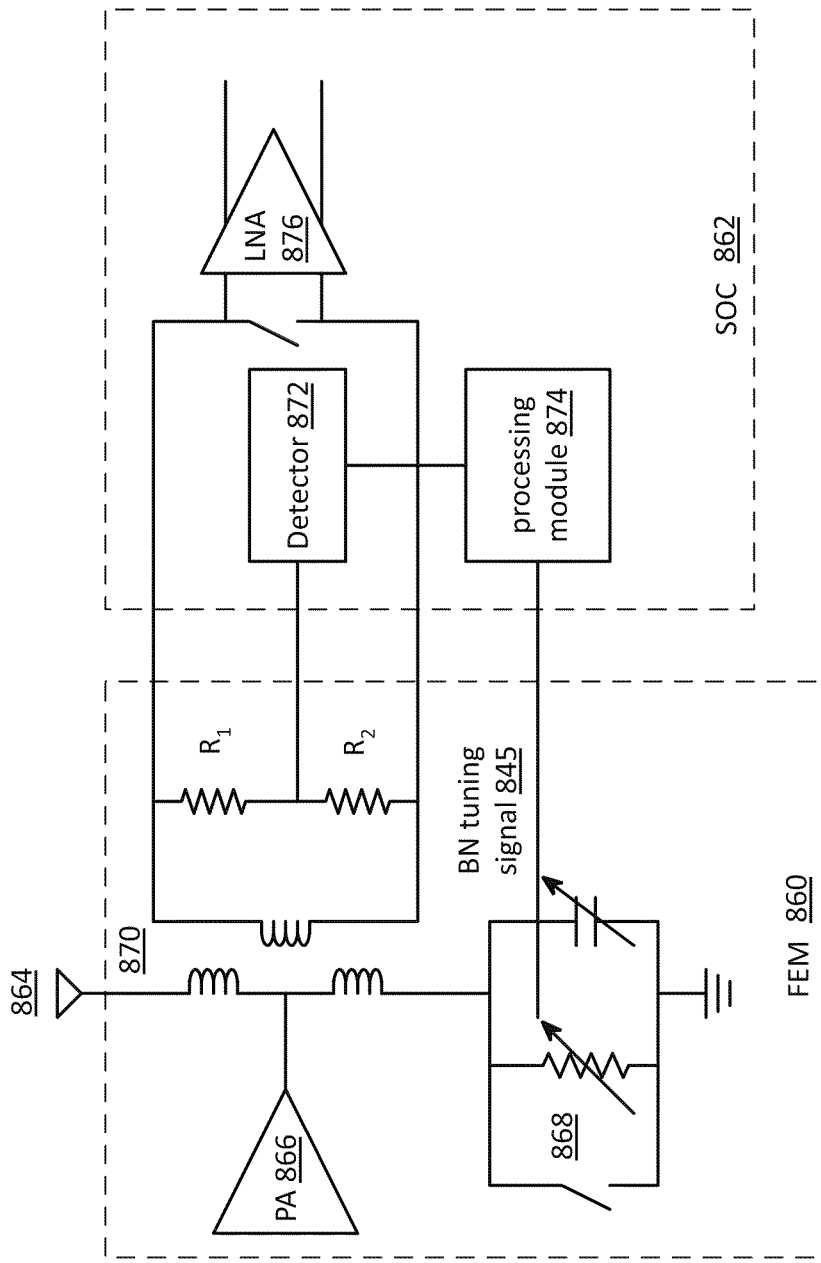
FIG. 13 is a schematic block diagram of another embodiment of a portion of each of a front-end module (FEM) and an SOC module in accordance with the present invention.

FIG. 13 is a schematic block diagram of another embodiment of a portion of each of a front-end module (FEM) 860 and an SOC 862 for 2G and 3G cellular telephone operations. The portion of the FEM 860 includes a power amplifier module (PA) 866, a duplexer 870, a gated balance network 868, and a common mode sensing circuit (R1 and R2). The duplexer 870 includes a transformer (or other structure such as a frequency selective duplexer and/or an electrical balance duplexer) and the gated balancing network 868 includes a shorting switch, at least a variable resistor, and at least one variable capacitor. The portion of the SOC 862 includes a peak detector 872, a processing module 874, a switch (as the LNA by-pass circuit 875), and a low noise amplifier module (LNA 876). Alternatively, the peak detector 872 and/or the tuning engine 874 may be within the FEM 860.

In this embodiment, the duplexer is optimized for frequency division duplex (FDD), which is used in 3G cellular telephone applications. In this mode, the switch of the gated balancing network 868 and the switch of the LNA by-pass circuit are open such that the gated balancing network provides an impedance substantially equal to the impedance of the antenna based on a tuning signal.

In time division duplex (TDD), which is used in 2G cellular telephone applications, the gated balancing network 860 is shorted via the switch. This essentially removes the 3-dB theoretical insertion loss limit and leaves just implementation loss. Note that for 2G transmissions, the LNA by-pass circuit switch is closed. For 2G receptions, the LNA by-pass circuit switch is open.

Figure 14:
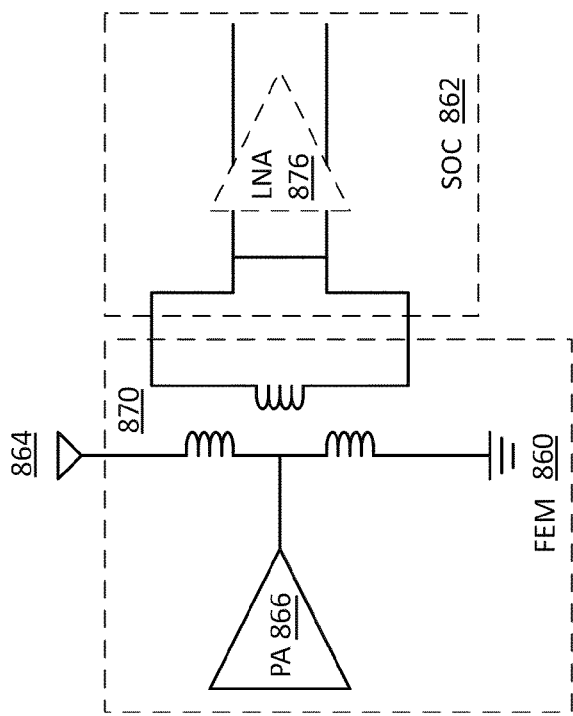
FIG. 14 is a schematic block diagram of another embodiment of a portion of each of a front-end module (FEM) and an SOC module in accordance with the present invention.

FIG. 14 is a schematic block diagram of an embodiment of a portion of each of a front-end module (FEM) 860 and an SOC 862 in 2G TX mode. In this mode, the LNA by-pass circuit switch shorts the LNA 876 and the balance network switch shorts the balance network. With a short across the secondary winding, the primary windings are essentially shorted. Thus, the PA 866 is effectively directly coupled to the antenna.

Figure 15:
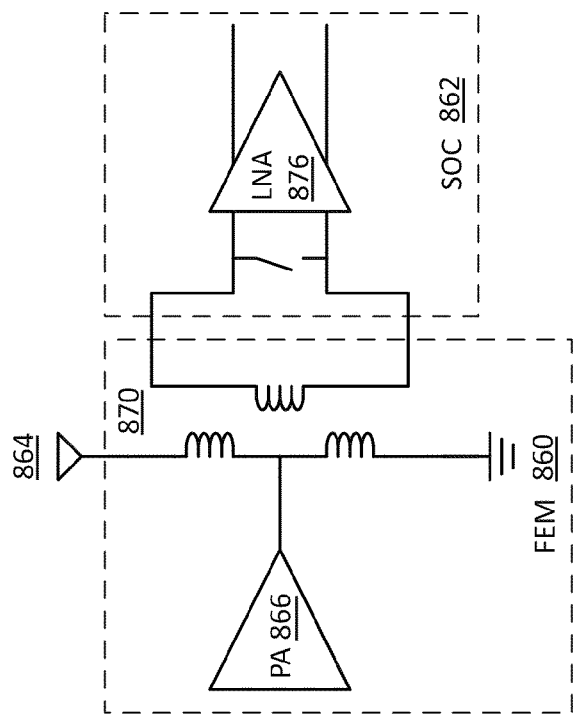
FIG. 15 is a schematic block diagram of another embodiment of a portion of each of a front-end module (FEM) and an SOC module in accordance with the present invention.

FIG. 15 is a schematic block diagram of an embodiment of a portion of each of a front-end module (FEM) 860 and an SOC 862 in 2G RX mode. In this mode, the LNA switch is open and the balance network switch is closed, thus shorting the balance network. In this configuration, the transformer is function as a transformer balun for the receiver section.

Figure 16:
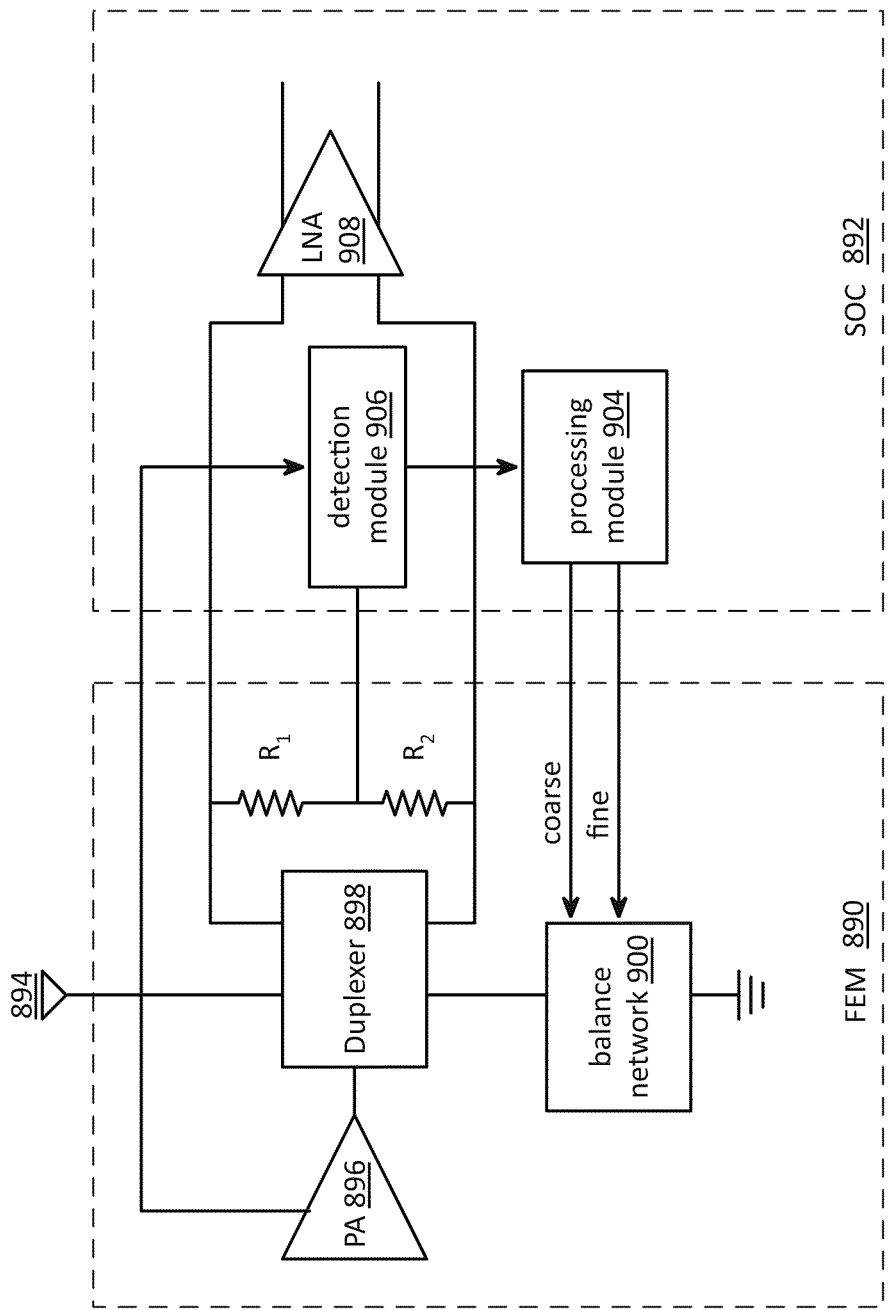
FIG. 16 is a schematic block diagram of an embodiment of a portion of each of a front-end module (FEM) and an SOC module in 2G TX mode in accordance with the present invention.

FIG. 16 is a schematic block diagram of another embodiment of a portion of each of a front-end module (FEM) 890 and an SOC 892. The portion of the FEM 890 includes a power amplifier module (PA) 896, a duplexer 898, a balance network 900, and a common mode sensing circuit (e.g., R1 & R2). The duplexer 898 includes a transformer (or other structure such as a frequency selective duplexer and/or an electrical balance duplexer) and the balancing network 900 includes at least a variable resistor and at least one variable capacitor and may further include an inductor. The portion of the SOC includes a peak detector 902, a tuning engine 904 (which may be implemented via a processing module), a detection 906 module, and a low noise amplifier module (LNA) 908. Alternatively, the peak detector 902, the leakage detection 906 module, and/or the tuning engine 904 may be within the FEM 890.

In an example of operation, the detection module detects a non-linear function of the power amplifier to produce a detected non-linearity. For instance, the detection module 906 detects variations of the on-resistance of the transistor within the PA 896 and/or within the balance network 900. As a more specific example, as the PA 896 output current increases, the on-resistance of the transistors within the PA 896 and/or within the balance network 900 increases. Such increases affect the overall impedance of the balance network 900. The detection module 906 provides the detected non-linearity to the processing module 904. Alternatively, or in addition to, the detection module 906 develops an envelope signal that tracks variations of the power amplifier based on the non-linearity of the on-resistance and provide the envelope signal to the processing module 904.

The detection module 906 further detects transmit leakage of the duplexer to produce detected transmit leakage. For example, the detection module 906 receives a common mode signal from the sensing circuit R1 and R2 and it generates the detected transmit leakage therefrom. As previously mentioned, an imbalance in the duplexer will cause an offset in the common mode voltage, which is sensed by the sensing circuit.

The processing module generates a coarse tuning signal based on the detected non-linearity and generates a fine tuning signal based on the detected transmit leakage. The processing module provides the coarse and fine tuning signals to the tunable balancing network 900, establishes an impedance based on the coarse and fine tuning signals. As such, the dual feedback loop of coarse and fine tuning adjusts for imbalances within the duplexer and performance variations (e.g., on-resistance) of the power amplifier and/or balancing network 900.

Figure 17:
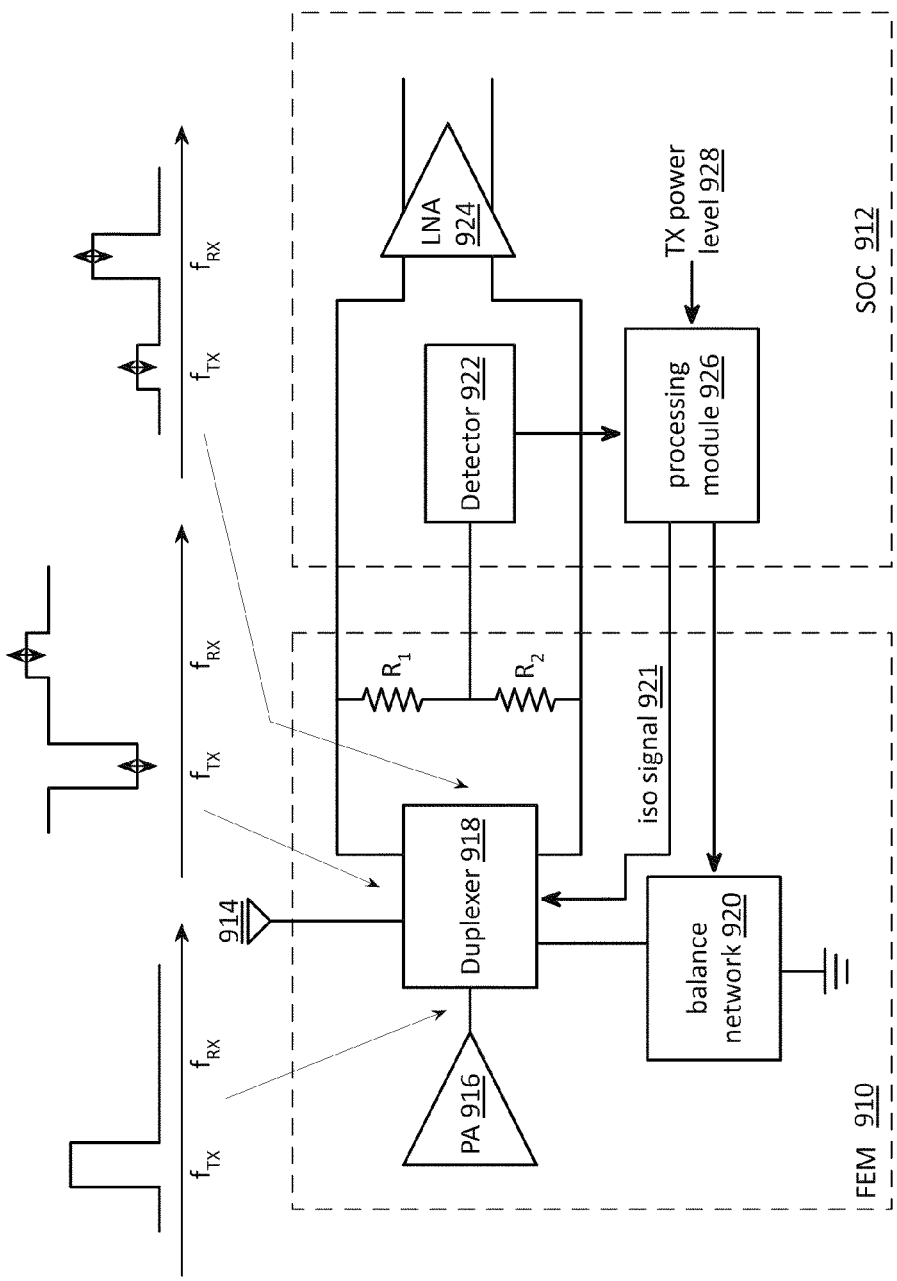
FIG. 17 is a schematic block diagram of an embodiment of a portion of each of a front-end module (FEM) and an SOC module in 2G RX mode in accordance with the present invention.

FIG. 17 is a schematic block diagram of another embodiment of a portion of each of a front-end module (FEM) 910 and an SOC module 912. The portion of the FEM 910 includes a power amplifier module (PA) 916, a duplexer 918, a balance network 920, and a sensing circuit (e.g., R1 & R2). The duplexer 918 includes a transformer (or other structure such as a frequency selective duplexer 918 and/or an electrical balance duplexer 918) and the balancing network includes at least a variable resistor and at least one variable capacitor. The portion of the SOC 912 includes a peak detector 922, a processing module 926 (which includes the function of the tuning engine), and a low noise amplifier module (LNA) 924. Alternatively, the peak detector 922 and/or the tuning engine may be within the FEM 910.

In an example of operation, the processing module 926 generates a tuning signal based on an imbalance in the duplexer and provides it to the balancing network 920 as previously described. In addition, the processing module 926 determines a transmit power level of the outbound wireless signal, which may be done in a variety of ways. For example, the processing module may provide a transmit power levels signal to the power amplifier 916, which it uses to establish the transmit power level. As another example, the front end module 910 may include a transmit signal strength indicator, which provide the transmit power level 928 to the processing module 926.

The processing module 926 compares the transmit power level 928 to isolation requirement. For example, when the transmit power level is relatively low (e.g., is a smaller blocker for the inbound RF signal and/or the signal strength of the inbound RF signal is relatively high), the transmit leakage within the duplexer would be proportionally lower. In such instances, the amount of attenuation of the transmit signal within the duplexer may be reduced and still provide adequate compensation of transmit leakage. As such, when the transmit power level compares favorably with an isolation requirement (e.g., is relatively low), the processing module 926 generates an isolation adjustment signal 921.

The processing module 926 sends the isolation adjustment signal 921 to at least one of the duplexer and the tunable balancing network. Upon receiving the isolation adjustment signal, the duplexer 918 adjusts the electrical isolation between the outbound wireless signal and the inbound wireless signal based on the isolation adjustment signal. For example, if the duplexer 918 is a frequency selective duplexer, it adjusts the electrical isolation between the outbound wireless signal and the inbound wireless signal by adjusting a filter of the one or more filters. As another example, if the duplexer 918 is an electrical-balance duplexer, the balancing network adjusts its impedance based on the isolation adjustment signal as a trade-off between loading of the duplexer 918 and the electrical isolation between the inbound and outbound wireless signals.

Figure 18:
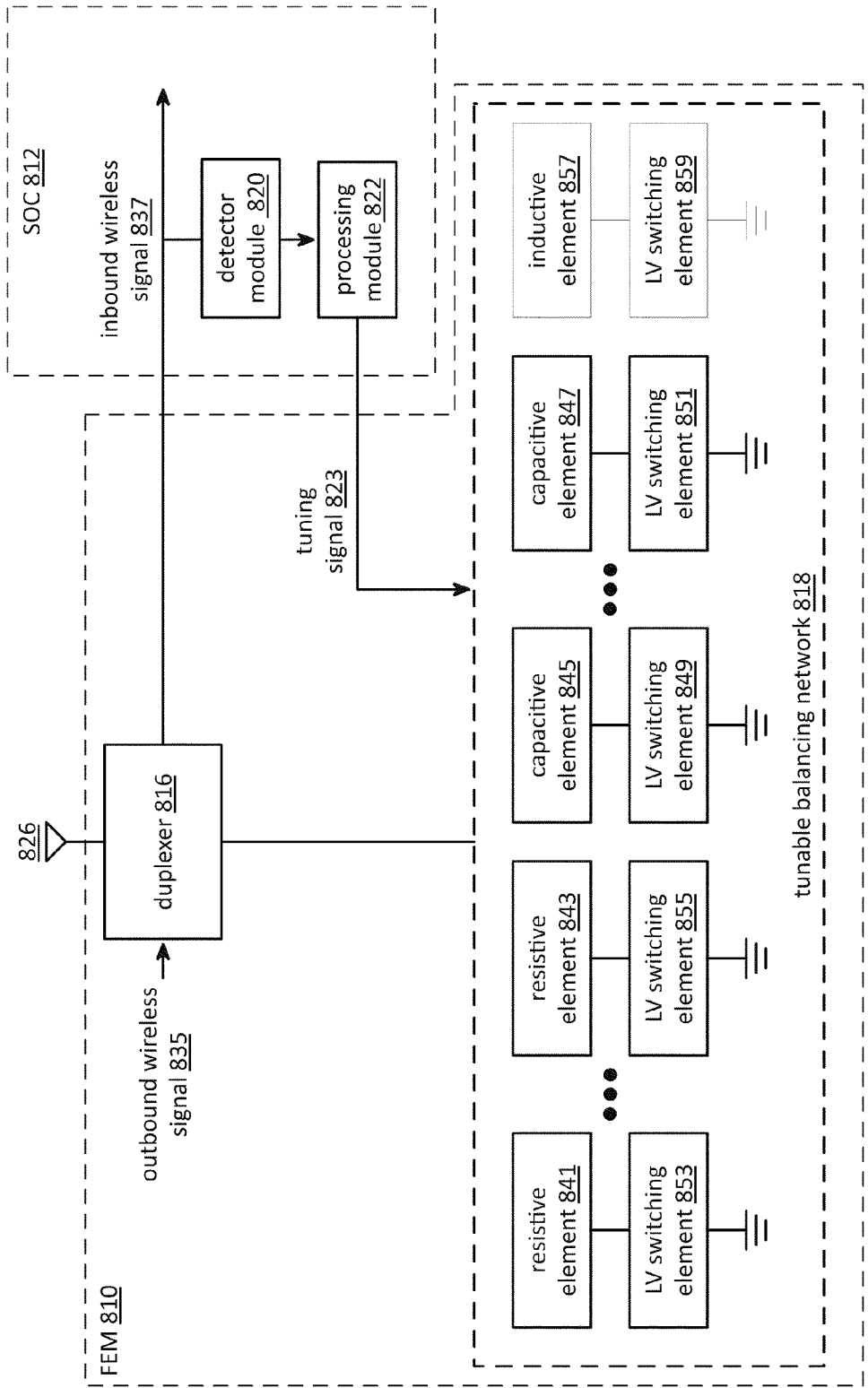
FIG. 18 is a schematic block diagram of another embodiment of a portion of each of a front-end module (FEM) and an SOC module in accordance with the present invention.

FIG. 18 is a schematic block diagram of another embodiment of a portion of each of a front-end module (FEM) 810 and an SOC module 812. The front end module 810 includes a power amplifier, a duplexer 816, and a tunable balancing network 818. The system-on-a-chip module 812 includes a detector module 820 and a processing module 822. The tunable balancing network 818 includes a plurality of resistive elements 841-843, a plurality of capacitive elements 845-847, and a plurality of low voltage switching elements 849-855. The tunable balancing network 818 may further include one or more inductive elements 857 that are coupled to a resistive element and/or a capacitive element.

In an example of operation, the power amplifier amplifies an up-converted signal into an outbound wireless signal 835. The duplexer 816 is operably coupled to an antenna and provides electrical isolation between the outbound wireless signal and an inbound wireless signal as previously discussed. The tunable balancing network establishes an impedance that substantially matches an impedance of the antenna based on a tuning signal 823. For example, the tuning signal may activate (e.g., small scale or large scale) one or more of the low-voltage switching elements of the tunable balancing network, which, in turn, couples one or more of the capacitive elements and one or more of the resistive elements to the duplexer as an impedance balancing load. Accordingly, by activating one or more of the low voltage switching elements, the impedance of the balancing network 818 is tuned within a given frequency range to substantially match that of the antenna. Note that by using low voltage switching elements, the balancing network is readily implementable on an integrated circuit where low-voltage is less than the voltage swing on the balancing network.

Figure 23:
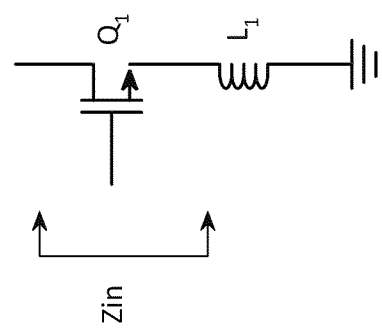
FIG. 23 is a schematic block diagram of another embodiment of an impedance in accordance with the present invention.
Figure 22:
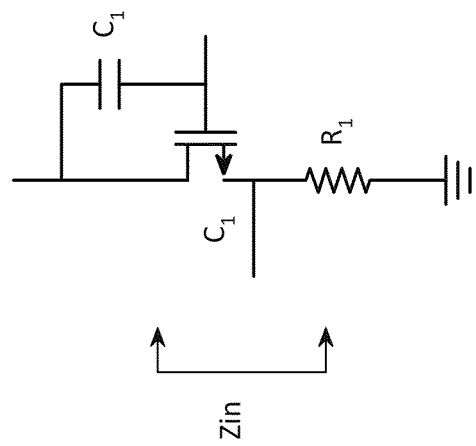
FIG. 22 is a schematic block diagram of an embodiment of an impedance in accordance with the present invention.

In the balancing network, a resistive element may be a resistor, a transistor-inductor based active resistor, and/or a switched capacitor. A capacitive element may be a capacitor and/or a varactor. Examples of various resistive elements are shown in FIGS. 22 and 23.

Figure 19:
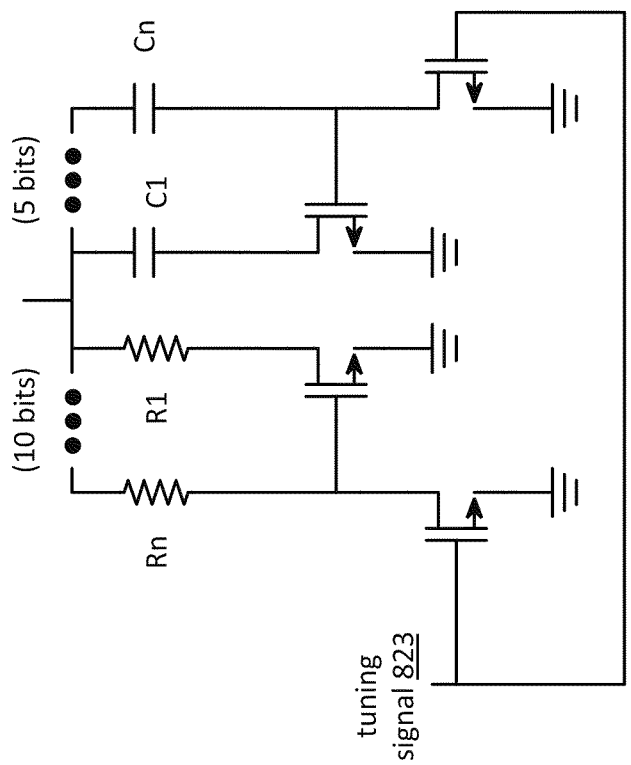
FIG. 19 is a schematic block diagram of an embodiment of a small signal balancing network in accordance with the present invention.

FIG. 19 is a schematic block diagram of an embodiment of a small signal balancing network 880 that includes a plurality of transistors, plurality of resistors, and a plurality of capacitors. The selection of resistors to include in the balance network may be controlled by a first set of bits of the tuning signal (e.g., 10 bits) and the selection of capacitors to include in the balance network may be controlled by a second set of bits of the tuning signal (e.g., 5 bits).

In an example embodiment of the tunable balancing network, a first resistive element of the resistive elements is coupled in series with a first switching element of the low-voltage switching elements; a second resistive element of the resistive elements is coupled in series with a second switching element of the low-voltage switching elements. A common node of the second resistive element and the second switching element is coupled to a control node of the first switching element. Such coupling continues for remaining ones of the plurality of resistive elements and low-voltage switching elements.

Continuing with the example embodiment, a first capacitive element of the capacitive elements is coupled in series with a third switching element of the plurality of low-voltage switching elements and a second capacitive element of the capacitive elements is coupled in series with a fourth switching element of the low-voltage switching elements. A common node of the second capacitive element and the fourth switching element is coupled to a control node of the third switching element. Such coupling continues for remaining ones of the plurality of capacitive elements and low-voltage switching elements.

In this example, the impedance of the tunable balancing network is tuned in accordance with small-signaling of the tuning signal. For instance, as the voltage of the tuning signal 823 is adjusted (within a small signaling range such that the transistors are in a linear region), the on-resistance of the transistors is varies such that the series and parallel combination of on-resistance, resistors (r1-Rn) and capacitors (C1-Cn) provide the desired impedance for the balancing network.

Figure 20:
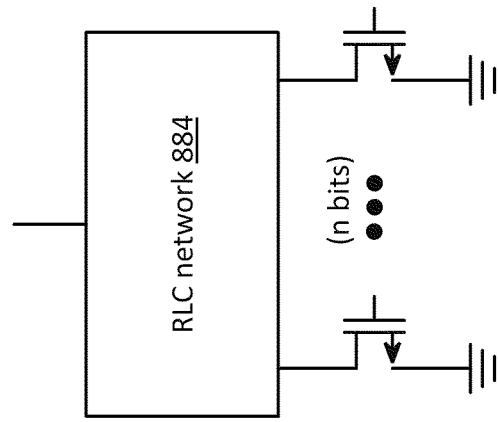
FIG. 20 is a schematic block diagram of an embodiment of a large signal balancing network in accordance with the present invention.

FIG. 20 is a schematic block diagram of an embodiment of a large signal balancing network 882 that includes an RLC (resistor-inductor-capacitor) network and a plurality of transistors. The transistors are gated on and off to provide different combinations of resistors, inductors, and/or capacitors of the RIC network to provide the desired impedance of the balance network. In this instance, the transistors have a relatively small voltage swing, and thus lower voltage transistors can be used.

For example, if the balance network includes four resistor-transistor circuits, four capacitor-transistor circuits, and one or more inductors, then the gating on & off the transistors establish the impedance for the balancing network. For instance, each of the gates also is coupled to receive a bit of a 4-bit control signal, where the gate of the left outer-most resistor-transistor circuit receives the most significant bit, the gate of the next left most resistor-transistor circuit receives the next most significant bit, and so on. Further, the resistor of the left most resistor-transistor circuit is R4, the resistor of the next left most resistor-transistor circuit is R3, and so on. Thus, for this example, when the 4-bit control signal is 0001, only the right most resistor transistor circuit is on and its resistor, R1, provides the resulting resistance. When the 4-bit control signal is 0011, the two right most resistor-transistor circuits are on and the resulting resistance is R1//R2. When the 4-bit control signal is 0111, the three right most resistor-transistor circuits are on and the resulting resistance is R1//R2//R3. When the 4-bit control signal is 1111, all four resistor-transistor circuits are on and the resulting resistance is R1//R2//R3//R4. The capacitor side of the balance network functions in a similar manner.

As an alternative embodiment, each resistor-transistor circuit and each capacitor-transistor circuit may be independently controlled by a bit of the corresponding control signals. For a four resistor-transistor circuit configuration as described in the preceding paragraph as modified herein, a control signal of 1000 would yield a resistance of R4; a control signal of 0100 would yield a resistance of R3; a control signal of 1010 would yield a resistance of R4//R2; and so on.

As yet another embodiment, a first resistive element of resistive elements is coupled in series with a first switching element of the plurality of low-voltage switching elements; a second resistive element of the resistive elements is coupled in series with a second switching element of the plurality of low-voltage switching elements; a first capacitive element of the capacitive elements is coupled in series with a third switching element of the low-voltage switching elements; and a second capacitive element of the capacitive elements is coupled in series with a fourth switching element of the low-voltage switching elements.

In this embodiment, the impedance of the tunable balancing network is tuned in accordance with large-signaling of the tuning signal. For instance, as the voltage of the tuning signal 823 is adjusted (within a large signaling range such that the transistors are either "on" or "off:"), the parallel and/or series combination of resistors (r1-Rn), capacitors (C1-Cn), and inductors (if any) provide the desired impedance for the balancing network.

Figure 21:
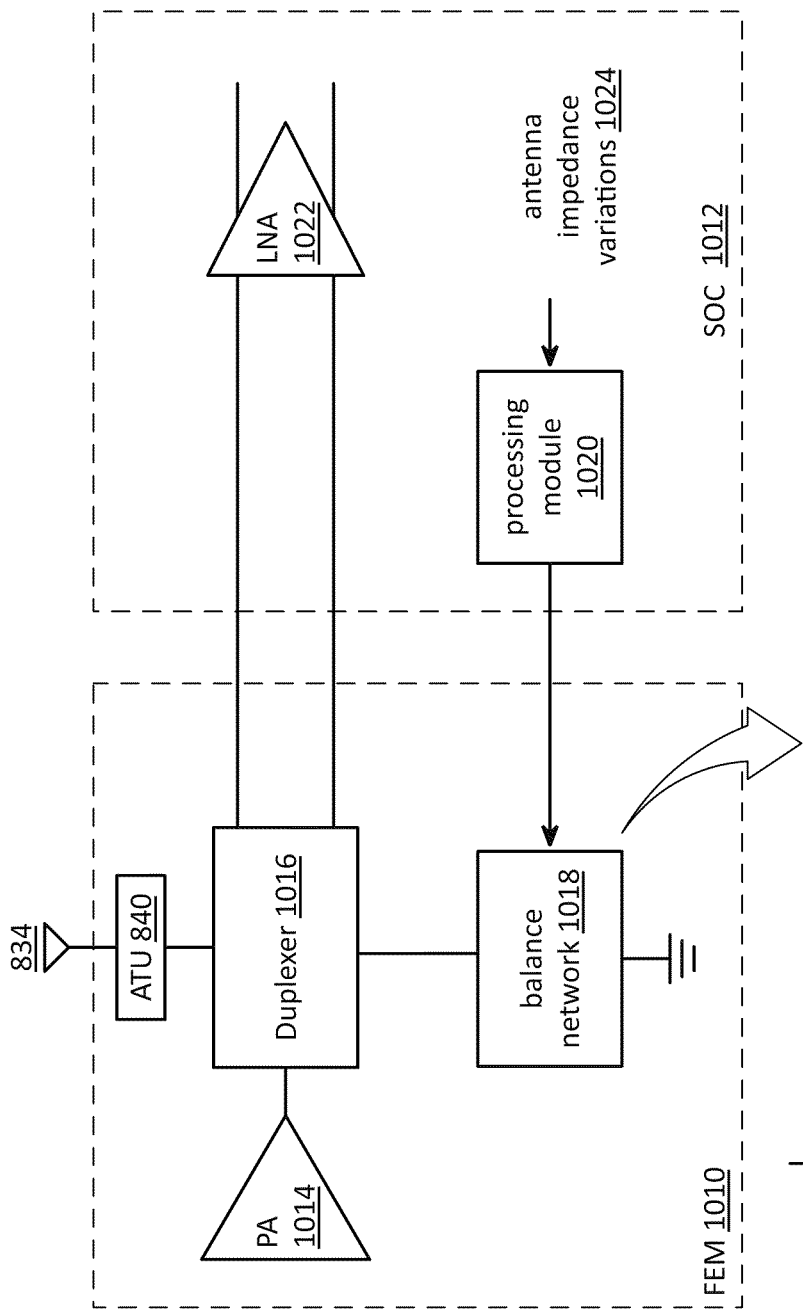
FIG. 21 is a schematic block diagram of another embodiment of a portion of each of a front-end module (FEM) and an LNA in accordance with the present invention.

FIG. 21 is a schematic block diagram of another embodiment of a portion of each of a front-end module (FEM) 1010 and an SOC module 1012. The portion of the FEM 1010 includes a power amplifier module (PA) 1014, a duplexer 1016, a balance network 1018, and an antenna tuning unit (ATU) 840. The duplexer 1016 includes a transformer (or other structure such as a frequency selective duplexer 1016 and/or an electrical balance duplexer 1016). The portion of the SOC 1012 includes a peak detector 1002 (not shown), a processing module 1020 (which performs the function of the tuning engine), and a low noise amplifier module (LNA) 1022. Alternatively, the peak detector 1002 and/or the tuning engine may be within the FEM 1010.

The balance network 1018 includes an RLC network having a plurality of variable resistors, a plurality of variable capacitors, and at least one inductor as shown. In this embodiment, the balance network 1018 can be tuned to provide a wide variety of impedance to enable a better matching to the impedance of the antenna. In addition, the balancing network has a wide tuning range for a desired voltage-standing-wave-ratio (VSWR) (e.g., 3:1), especially when tuned in conjunction with the tuning of the ATU.

FIG. 22 is a schematic block diagram of an embodiment of an impedance of a resistor-transistor (R-T) circuit of a balance network. The capacitor corresponds to the parasitic capacitance of the transistor. Because the R-T circuit includes a real passive resistor, it contributes to the 3 dB theoretical limit on insertion loss.

FIG. 23 is a schematic block diagram of another embodiment of an impedance of a resistor-transistor (R-T) circuit of the balance network. In this embodiment, the R-T circuit includes an inductively degenerated common-source transistor. As such, it is an active resistance and does not contribute to the 3 dB theoretical limit on insertion loss. Thus, the only loss due to the balance network is implementation loss.

In particular, the R-T circuit provides an active gyrator within the balancing network by using active devices instead of a passive resistor. With an active gyrator, the TX insertion loss does not change because it depends on the value of the resistance, but the RX noise figure is improved because the noise associated with the resistance is reduced in an active implementation. For example, in one possible implementation of the resistor as the input impedance of a common-gate MOSFET, the resistance is given by: $R=1/gm$. The noise power spectral density of such resistor is $4KT\gamma/gm$ or $4KT\gamma R$ where K is the Boltzmann's constant, T is the temperature in Kelvin and $\gamma$ is the thermal noise parameter and is a function of the technology. On the other hand, a passive resistor has a fixed noise power spectral density given by: $4KTR$. For recent deep submicron technologies the value of $\gamma$ is less than 1, thus a resistor implemented using common-gate MOSFET generates less noise for the same resistance.

Figure 24:
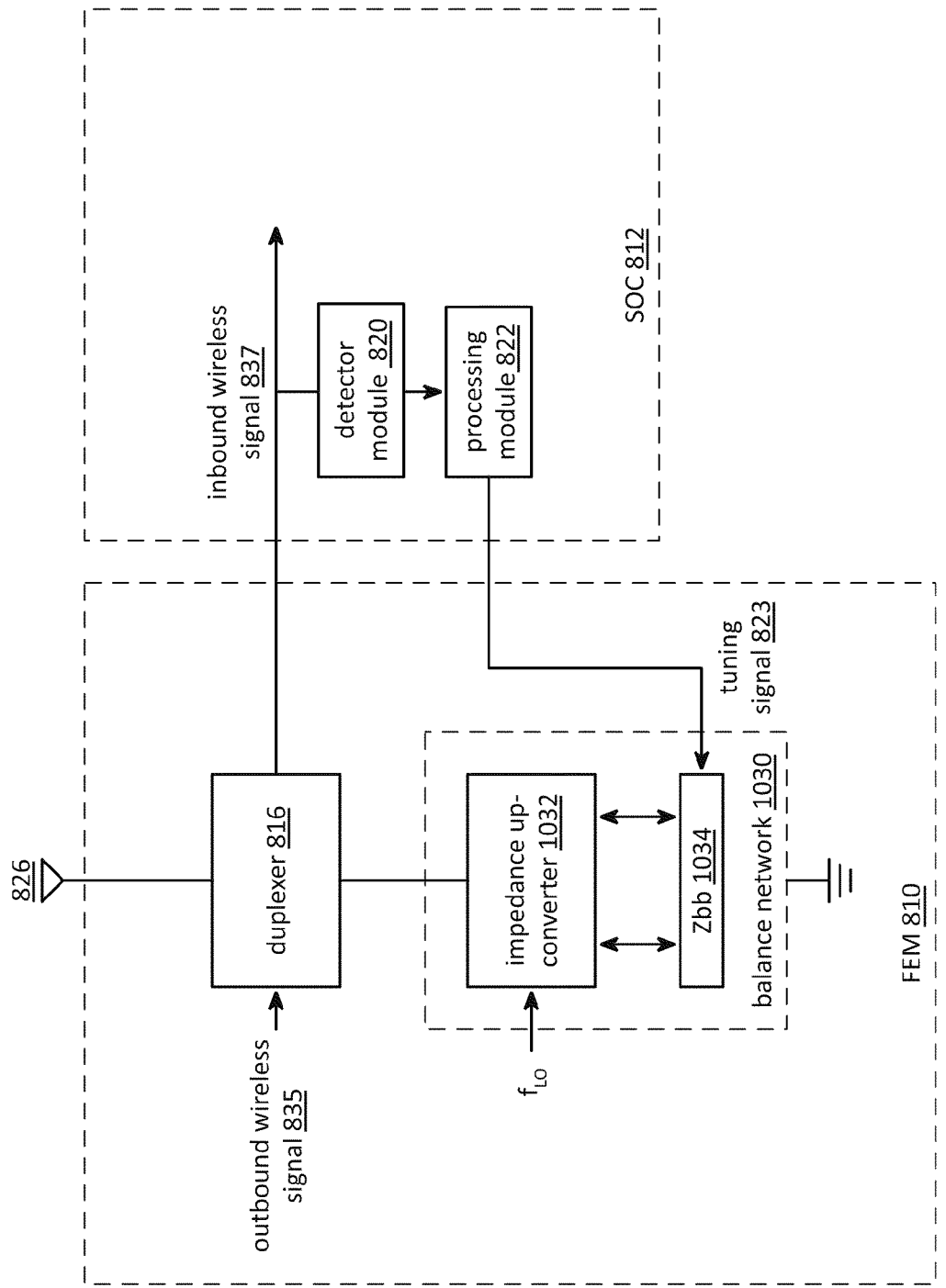
FIG. 24 is a schematic block diagram of an embodiment of a balancing network in accordance with the present invention.

FIG. 24 is a schematic block diagram of another embodiment of a portion of each of a front-end module (FEM) 1010 and an SOC module 1012. The front end module 1010 includes the duplexer 816 and a balancing network 1030. The system-on-a-chip module 812 includes the detector module 820 and the processing module 822. The balancing network 1013 includes an impedance up converter 1032 and a baseband impedance circuit 1034.

In an example of operation, the baseband impedance circuit generates an impedance based on the tuning signal 823. The impedance up-converter 1032, which is clocked at a desired frequency (e.g., $f_{LO}$ or $f_{RF}$), up-converts the baseband impedance to a radio frequency impedance. When tuned, the radio frequency impedance of the balancing network 1013 substantially matches the impedance of the antenna 826 within a given frequency band of operation.

FIG. 25 is a schematic block diagram of an embodiment of the balancing network 1030, which includes a plurality of transistors (e.g., a multi-phase transistor switching network as the up-conversion module) and a plurality of baseband impedances ($Z_{BB}(s)$) 396-402. Each of the baseband impedances may include a plurality of capacitive elements, a plurality of resistive elements, and a plurality of switching elements. For each of the baseband impedances one or more of the capacitive elements and/or one or more of the resistive are coupled together based on the tuning signal to produce the baseband impedance. Note that a resistive element may be a resistor, a transistor-inductor based active resistor, and/or a switched capacitor and that a capacitive element may be a capacitor and/or a varactor.

In an example of operation, the balancing network receives the tuning signal 832 and adjusts the baseband impedance accordingly. The transistors are switched using a four-phase clock as generated by a clock generator 404 of FIG. 26. As shown in FIG. 26, the clock generator 404 produces four clocks signals each having a 25% duty cycle and sequentially offset by 90°. The clock signals have a frequency corresponding to the carrier frequency of the inbound and/or outbound RF signal and can be adjusted to better track the carrier frequency.

FIG. 27 illustrates the frequency translation of the baseband impedance to the RF impedance. As shown, the baseband impedance is tuned to have a desired impedance at DC (e.g., 50 Ohms). The up-conversion module modulates the baseband impedance to +/−RF frequency.

FIG. 28 is a schematic block diagram of another embodiment of a balance network that includes two impedance up-converters 1042, 1044 and two corresponding baseband impedances (Zbb 1046, 1048). Each of the impedance up-converters is clocked at a desired frequency (e.g., $f_{RF\_TX}$ and $f_{RF\_Rx}$). For example, up-converter 1042 may be clocked at a frequency within a first frequency band and up-converter 1044 may be clocked at a frequency within a second frequency band.

As a further example, the first frequency band of operation corresponding to a transmit frequency band of a wireless communication protocol and the second frequency band of operation corresponding to a receive frequency band of the wireless communication protocol. As another example, the first frequency band of operation corresponding to a frequency band of a first wireless communication protocol and the second frequency band of operation corresponding to a frequency band of a second wireless communication protocol. Note that each of the combinations of an impedance up-converter 1042, 1044 and its corresponding baseband impedance may be implemented in a similar fashion as previously discussed with reference to FIG. 27.

FIG. 29 is a schematic block diagram of a front end module that includes a duplexer 816 and a balancing network 818. The duplexer 816 includes a first winding 871, a second winding 773, a third winding 875, and a compensation module 877. The windings are coupled to have five nodes: the first node for operably coupling an antenna to the first winding; the second node operable to receive an outbound wireless signal and operably couples the first winding to the second winding; the third node operably couples the second winding to a balancing network; the fourth node operably coupled to output a first signal component corresponding to an inbound wireless signal from the third winding; and the fifth node operably coupled to output a second signal component corresponding to an inbound wireless signal from the third winding.

In an example of operation, the duplexer 816 receives an outbound wireless signal 835 at the common note between the first and second windings 871 & 873. The current of the outbound wireless signal 835 is split between the first and second windings, which are represented as $I_{TX\text{-}ANT}$ and $I_{TX\text{-}BN}$. If the impedance of the balance network 818 matches the impedance of antenna 826, then the transmit antenna current and the balance network current will be approximately equal. With these currents being approximately equal, they effectively cancel each other with respect to the third winding such that the third winding has a negligible TX leakage component. If, however, an imbalance exists between the impedance of the balance network 818 and the antenna 826, a non-negligible transmit leakage current will be present on the third winding.

A series combination of the first winding 871 and second winding 873 receives an inbound wireless signal, which has a current component $I_{RX}$, from the antenna 826. With a high output impedance of the PA, the series coupled first and second windings magnetically coupled the received current to the third winding 875 to produce the inbound wireless signal 837. If there is an imbalance between the impedances of the antenna 826 and a balance network 818, a transmit the leakage current will be present on the third winding.

Even if the impedances of the balance network 818 and antenna 826 are substantially equal, there may be an imbalance within the duplexer that causes a transmit leakage current to appear on the third winding. The imbalance may be caused by an imbalance between the parasitic capacitances of the windings. In this instance, the compensation module 877 is operable to compensate the electrical isolation between the first and second signals and the outbound wireless signal due to an imbalance within the duplexer 816.

Figure 30:
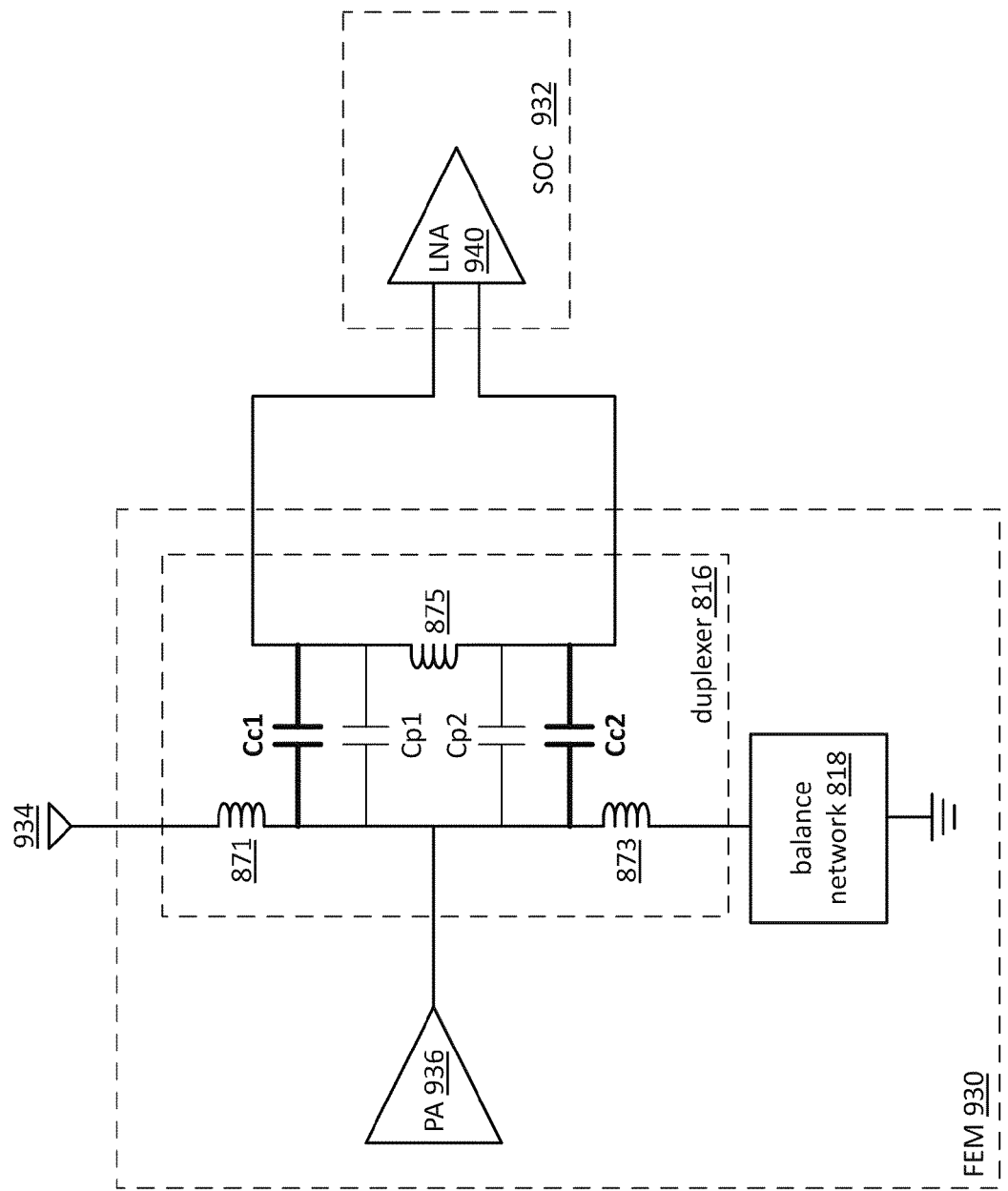
FIG. 30 is a schematic block diagram of another embodiment of a portion of each of a front-end module (FEM) and an SOC module in accordance with the present invention.

FIG. 30 is a schematic block diagram of another embodiment of a portion of each of a front-end module (FEM) 930 and an SOC 932. The portion of the FEM 930 includes a power amplifier module (PA) 936, a duplexer 816, and a balance network 818. The duplexer 816 includes a transformer having three windings 871, 873, & 875, and parasitic capacitances Cp1 & Cp2. The compensation module 877 includes compensating capacitors Cc1 & Cc2. The portion of the SOC 932 includes a peak detector, a processing module (which includes the function of the tuning engine), and a low noise amplifier module (LNA) 940. Only the LNA 940 is shown.

In this embodiment, the compensation capacitors Cc1 & Cc2 compensate for mismatches of the parasitic capacitances (e.g., Cp1 and Cp2), which may result due to a mismatch between the windings of the primary (e.g., L1 and L2). As such, the compensating capacitors (Cc1 and Cc2) are selected such that Cp1+Cc1=Cp2+Cc2. By adding the compensation capacitors, the isolation bandwidth of the duplexer 938 is greater than without the compensation capacitors and further reduces transmit leakage.

Figure 31:
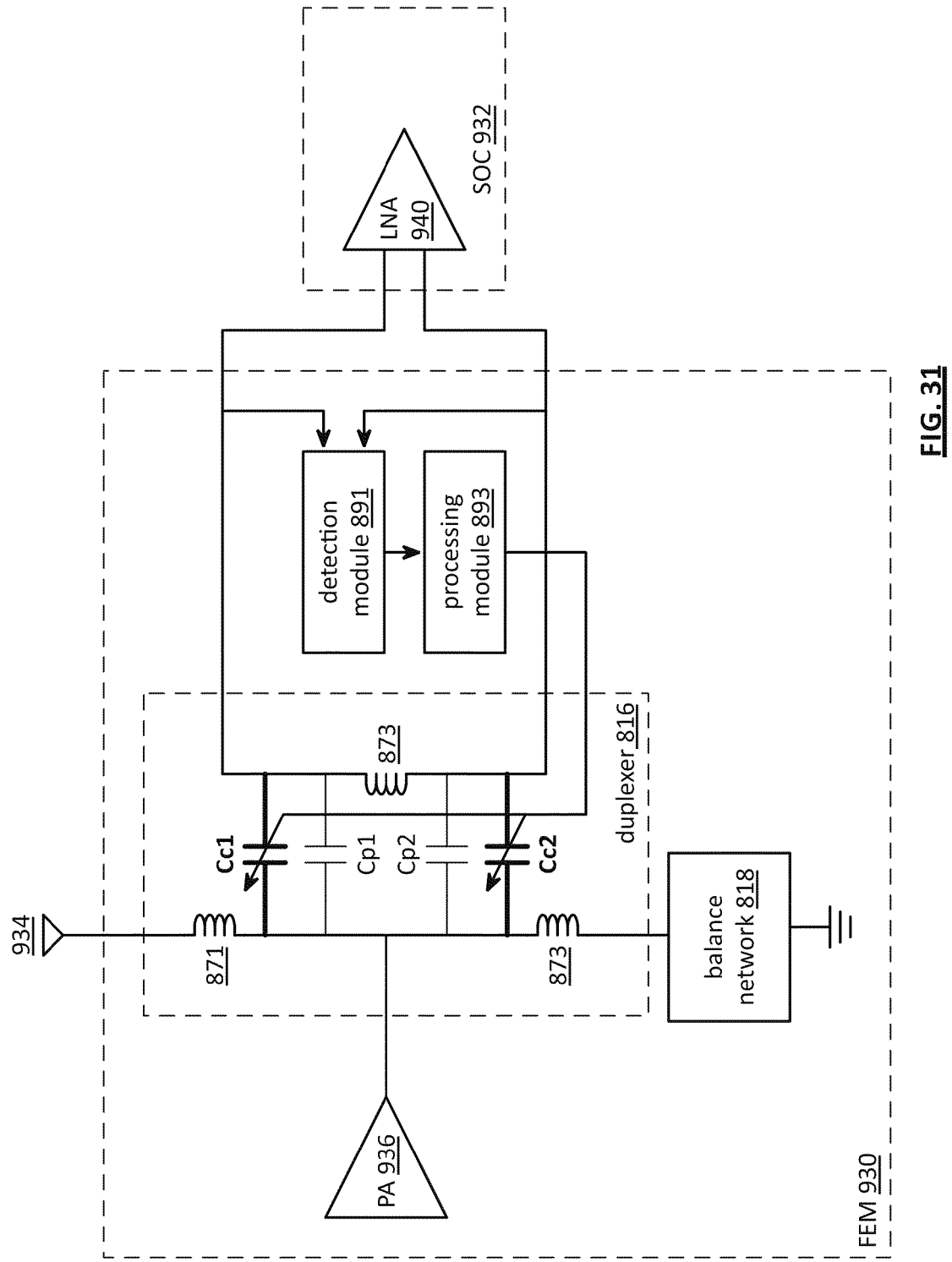
FIG. 31 is a schematic block diagram of another embodiment of a portion of each of a front-end module (FEM) and an SOC module in accordance with the present invention.

FIG. 31 is a schematic block diagram of another embodiment of a portion of each of a front-end module (FEM) 930 and an SOC 932. The portion of the FEM 930 includes a power amplifier module (PA) 936, a duplexer 816, and a balance network 818. The duplexer 816 includes a transformer having three windings 871, 873, & 875, and parasitic capacitances Cp1 & Cp2. The compensation module 877 includes compensating capacitors Cc1 & Cc2, a detection module 891, and a processing module 893. The portion of the SOC 932 includes a peak detector, a processing module (which includes the function of the tuning engine), and a low noise amplifier module (LNA) 940. Note that the detection module 891 and/or the processing module 893 may be in the SOC 932.

In this embodiment, the compensation capacitors Cc1 & Cc2 are adjustable to compensate for mismatches of the parasitic capacitances (e.g., Cp1 and Cp2). As such, the compensating capacitors (Cc1 and Cc2) are adjusted such that Cp1+Cc1=Cp2+Cc2. To determine the setting for the compensating capacitors, the detection module detects an imbalance between the first and second parasitic capacitances. This may be done by detecting a transmit leakage on the third winding, determining the portion of the transmit leakage to an imbalance between the impedances of the balancing network and the antenna, and estimating (or calculating) the portion of the transmit leakage due to parasitic capacitance imbalance.

The processing module determines the capacitances of the first and second compensation capacitors based on the imbalance between the first and second parasitic capacitances. The processing module then generates a first capacitance setting based on the determined capacitance of the first compensation capacitor and a second capacitance setting based on the determined capacitance of the second compensation capacitor.

Figures 32, 33:
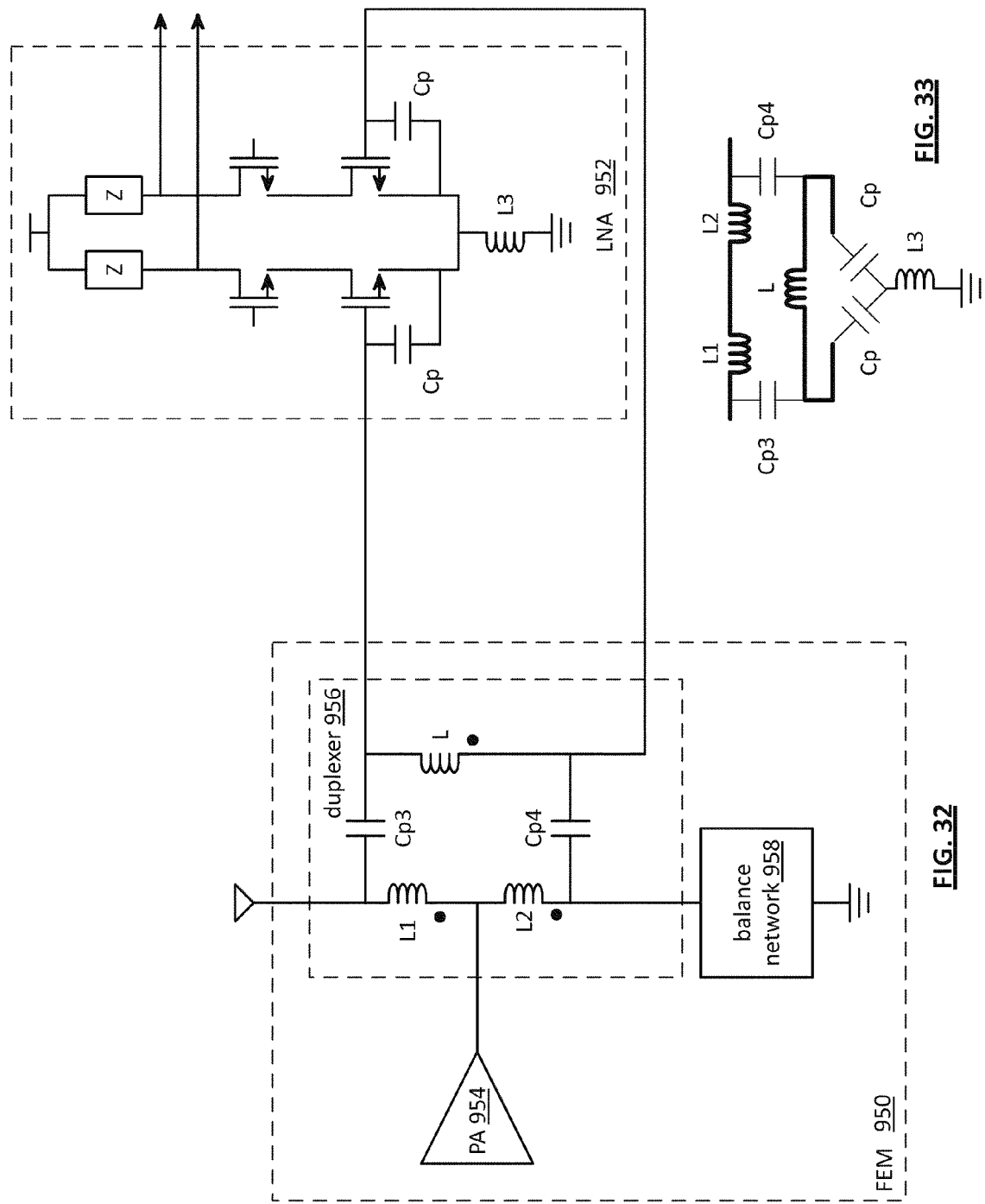
FIG. 32 is a schematic block diagram of another embodiment of a portion of each of a front-end module (FEM) and an LNA in accordance with the present invention.
FIG. 33 is a schematic block diagram of an embodiment of an equivalent circuit of a portion of each of a front-end module (FEM) and an LNA in accordance with the present invention.

FIG. 32 is a schematic block diagram of another embodiment of a portion of each of a front-end module (FEM) 950 and an LNA 952. The portion of the FEM 950 includes the power amplifier module (PA) 954, the duplexer 956, and the balance network 958. The duplexer 956 includes the transformer having three windings and parasitic capacitance (Cp3 and Cp4). The LNA 952 includes input transistors, which have parasitic capacitance (Cp), bias transistors, a common-mode isolation circuit, and load impedances (Z). The common-mode isolation circuit includes an inductor (L3) as a common mode degeneration inductor and first and second capacitors. In an example, the first and second capacitors may be the LNA's parasitic capacitors Cp3 & Cp4. In another example, the first and second capacitors may be coupled in parallel with the parasitic capacitors.

With the inclusion of the common-mode isolation compensation circuit in the LNA 952, transmit leakage is further reduced. As such, even if the balancing network and the compensation module cannot completely compensated for the imbalances, the common mode isolation circuit of LNA 952 further reduces the adverse affects of transmit leakage.

FIG. 33 is a schematic block diagram of an embodiment of an equivalent circuit of a portion of each of a front-end module (FEM) and an LNA of FIG. 32. This diagram illustrates how the common mode isolation is improved. Imbalanced currents coupled to the secondary winding (L) by the transformer's parasitic capacitance (Cp3 and Cp4), are coupled to separate tank circuits formed by the inductor (L3) and the parasitic capacitance of the input transistors. The tank circuits provide a high differential impedance, but a low common mode impedance, which suppresses the imbalances.

Figure 34:
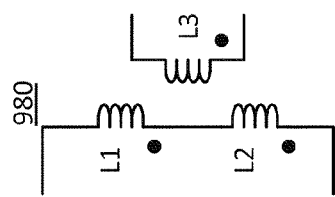
FIG. 34 is a schematic block diagram of an embodiment of a transformer balun in accordance with the present invention.

FIG. 34 is a schematic block diagram of an embodiment of a transformer 980 of the duplexer. The transformer includes the primary windings (L1 & L2) and a secondary winding (L3). The primary windings each have the same number of turns; the secondary winding may have the same number of turns as a primary winding or different number of turns. The orientation of the windings is as shown.

Figure 35:
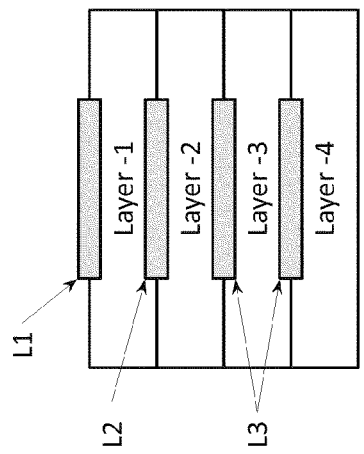
FIG. 35 is a diagram of an example of an implementation of a transformer balun in accordance with the present invention.

FIG. 35 is a diagram of an example of an implementation of a transformer implemented on 4 thick metal layers of an integrated circuit, of an IC packaging substrate, and/or on a printed circuit board. The primary windings are on the top two layers and the secondary winding is on the two lower layers. The windings of the secondary, which are on the third and fourth layers, may be connected in series or in parallel.

Figure 36:
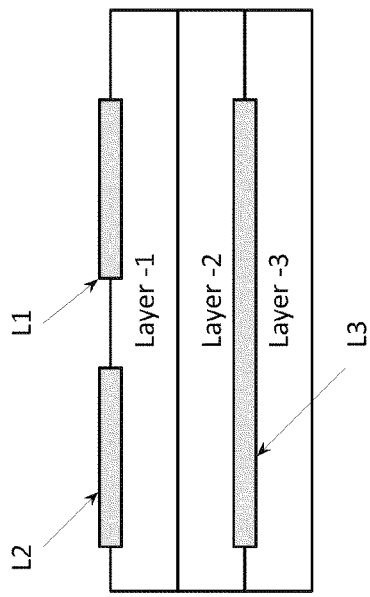
FIG. 36 is a diagram of another example of an implementation of a transformer balun in accordance with the present invention.

FIG. 36 is a diagram of another example of an implementation of a transformer on 3 thick metal layers of an IC, of an IC package substrate, and/or of a printed circuit board. The primary windings are on the top layer and use the next layer for interconnections and may be rotated by 90° with respect to the orientation of the secondary winding. The secondary winding is on the second and/or third lower layers.

Figure 37:
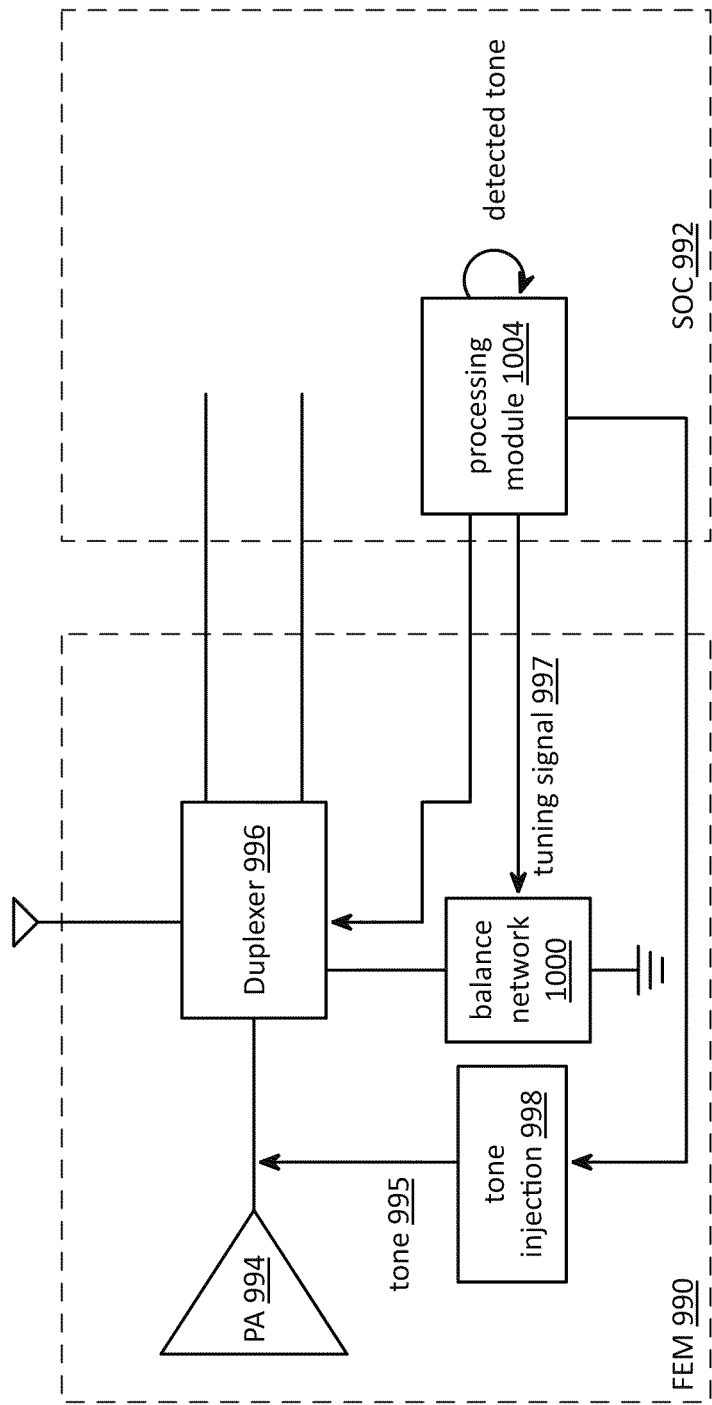
FIG. 37 is a schematic block diagram of another embodiment of a portion of each of a front-end module (FEM) and an SOC module in accordance with the present invention.

FIG. 37 is a schematic block diagram of another embodiment of a portion of each of a front-end module (FEM) 990 and an LNA 992. The front-end module 990 includes a power amplifier 994, a duplexer 996, a balance network 1000, and a tone injection module 998. The system-on-a-chip module 992 includes a processing module 1004 and may further include other components as previously described.

In situations where the transmit noise in the receive path and/or receive band noise is below the noise floor of the low noise amplifier, further compensation of the transmit noise and/or receive band noise can be detected and subsequently compensated for by including a tone injection module 998. For example, the tone injection module 998 (which may be an oscillator, a phase locked loop, a direct digital frequency synthesizer, etc.) produces, in a first mode, a tone 995 having a carrier frequency that is substantially similar to a carrier frequency of an inbound wireless signal. The tone 995 is injected into the outbound wireless signal received by the duplexer 996, which may be done by summing the tone with the output of the PA or with the input of the PA.

The duplexer 996, which operably coupled to an antenna, provides, in the first mode, electrical isolation between the outbound wireless signal and a combination signal of the tone and inbound wireless signal. In a second mode, the duplexer 996 provides electrical isolation between the outbound wireless signal and the inbound wireless signal (e.g., the tone is not present). The balancing network 1000 establishes an impedance that substantially matches an impedance of the antenna based on a tuning signal 997.

The processing module 1004 determines an amplitude of a tone component of the combination signal. This may be done at baseband, an intermediate frequency, or at RF. The processing module 1004 then correlates the amplitude of the tone component to an inbound frequency band isolation signal (e.g., a measure of the receive band noise and/or the transmit noise on the receive path). The processing module 1004 then adjusts baseband processing of a down converted representation of the combination signal based on the inbound frequency band isolation. For example, with the inbound frequency band isolation signal being a measure of receive band noise and/or transmit noise on the receive path, these noise components can be digitally filtered during the baseband conversion process.

The processing module 1004 may be further operable to enable the first mode when noise of the inbound wireless signal compares favorably to a noise threshold (e.g., is below the noise floor of the LNA). Alternatively, the processing module enables the second mode when the noise of the inbound wireless signal compares unfavorably to the noise threshold, wherein the tone injection module is disabled in the second mode.

The processing module 1004 may still be further operable to generate a tuning signal 997 based on electrical performance characteristic of duplexer 996 as previously discussed. The processing module then sends the tuning signal 997 to the balancing network 1000, which adjusts the impedance based on the tuning signal 997. The processing module then adjusts the tuning signal based on inbound frequency band isolation to further compensate noise on the receive path.

Figure 38:
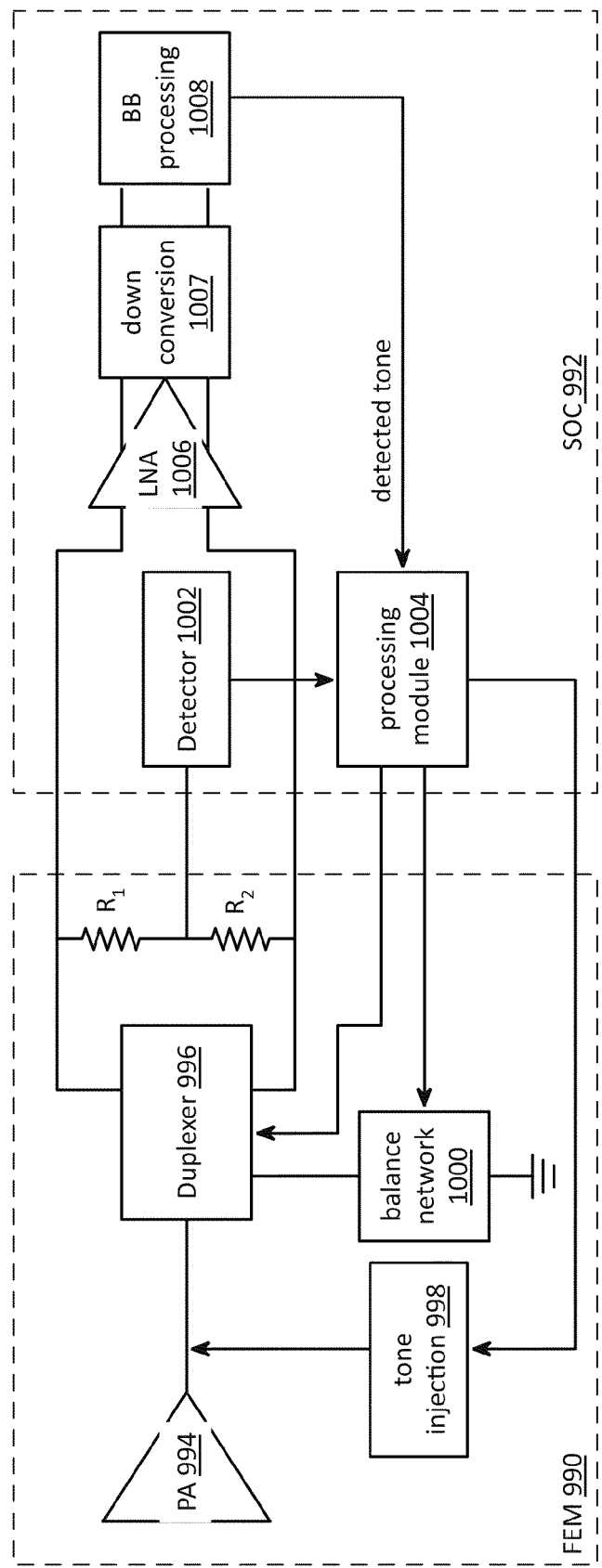
FIG. 38 is a schematic block diagram of another embodiment of a portion of each of a front-end module (FEM) and an SOC module in accordance with the present invention.

FIG. 38 is a schematic block diagram of another embodiment of a portion of each of a front-end module (FEM) 990 and an SOC 992. The portion of the FEM 990 includes a power amplifier module (PA) 994, a duplexer 996, a balance network 1000, a tone injection module 998, and a sensing circuit (e.g., R1 & R2). The duplexer 996 includes a transformer (or other structure such as a frequency selective duplexer and/or an electrical balance duplexer) and the balancing network 1000 includes at least a variable resistor and at least one variable capacitor. The portion of the SOC 992 includes a detector 1002, a processing module 1004 (which performs the function of the tuning engine), a baseband processing unit 1008, and a low noise amplifier module (LNA) 1006. Alternatively, the peak detector 1002 and/or the tuning engine may be within the FEM 990.

In an example of operation, the sensing circuit, the tuning engine, the detector 1002 and the balance network 1000 function as previously discussed to balance the impedances of the balancing network and the antenna. In many instances, this will reduce the transmitter (TX) and/or receiver (RX) noise in the receiver band below or comparable to the noise floor of the LNA 1006. With the TX and/or RX noise at or below the noise floor, it is difficult to track, which adversely affects the tracking of the impedance of the antenna.

To improve the tracking of the antenna impedance, the tone injection 998 module injects a tone in the receiver frequency band (e.g., $A \cos(\omega_{RX\_RF}(t))$). The duplexer 996 attenuates the RX tone differently than a TX signal because it is in the RX band and the duplexer 996 and balance network 1000 are tuned for the TX band. As such, a readily detectable leakage signal is produced on the RX side of the duplexer 996 (e.g., on the secondary of the transformer).

The RX tone-based leakage signal is propagated through the receiver section until it is converted into a baseband signal. At baseband, the tone amplitude is a measure of the RX band isolation. From the measure of RX band isolation, the antenna's impedance can be determined. As the antenna impedance changes, the antenna tuning unit and/or the balance network 1000 may be adjusted to track the antenna's impedance. Note that the tone may be easily removed at baseband.

In an example of operation, the power amplifier amplifies an up-converted signal to produce an outbound wireless signal. The tone injection module produce a tone having a carrier frequency that is substantially similar to a carrier frequency of an inbound wireless signal, where the tone signal is combined with the outbound wireless signal. The duplexer 996 provides electrical isolation between the outbound wireless signal and a combination signal of the tone and the inbound wireless signal. The balancing network establishes an impedance that substantially matches an impedance of the antenna based on a tuning signal.

The duplexer 996 provides an inbound wireless signal to the low noise amplifier 1006, where the inbound wireless signal includes an inbound RF signal component and a tone component. The LNA amplifies the combination signal to produce an amplified combination signal, which is converted into a baseband or near-baseband signal by the down conversion module 1007.

The processing module generates the tuning signal based on an electrical performance characteristic of the duplexer as previously discussed. The processing module then converts the baseband or near-baseband signal into a baseband tone signal and a baseband inbound signal. The processing module then determines an inbound frequency band isolation based on the baseband tone signal (which is a measure of RX band isolation) and adjusts the tuning signal based on the inbound frequency band isolation. The processing module may also adjust the baseband inbound signal based on the inbound frequency band isolation to compensate for transmit noise in an inbound frequency band.

In the preceding figures, some elements have common or similar names and the same or different reference numbers. For these elements (e.g., the FEM, the SOC, the duplexer, the balancing network, etc.), an element may include any combination of features and/or characteristics of the elements having the various names and/or different reference numbers.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:
1. A radio front end comprises:
  a power amplifier operably coupled to amplify an up-converted signal to produce an outbound wireless signal;
  a tone injection module operable, in a first mode, to produce a tone having a carrier frequency that is substantially similar to a carrier frequency of an inbound wireless signal;
  a duplexer operably coupled to an antenna, the power amplifier, and the tone injection module, wherein the duplexer is operable, in the first mode, to provide electrical isolation between the outbound wireless signal and a combination signal of the tone and inbound wireless signal and is operable, in a second mode, to provide electrical isolation between the outbound wireless signal and the inbound wireless signal;
  a balancing network operably coupled to the duplexer and operable to establish an impedance that substantially matches an impedance of the antenna;
  a processing module operable in the first mode to:
    determine an amplitude of a tone component of the combination signal;
    correlate the amplitude of the tone component to an inbound frequency band isolation; and
    adjust baseband processing of a down converted representation of the combination signal based on the inbound frequency band isolation.

2. The radio front end of claim 1, wherein the processing module further functions to:
  enable the first mode when noise of the inbound wireless signal compares favorably to a noise threshold; and
  enable the second mode when the noise of the inbound wireless signal compares unfavorably to the noise threshold, wherein the tone injection module is disabled in the second mode.

3. The radio front end of claim 1 further comprises:
  a low noise amplifier operably coupled to amplify the combination signal to produce an amplified combination signal; and
  a down-conversion module operable to convert the amplified combination signal into a baseband or near-baseband signal.

4. The radio front end of claim 3, wherein the processing module is further operable to adjust the baseband processing of the down converted representation of the combination signal by:

determining a down-converted tone component from the down converted representation of the combination signal;

determining a transmit noise based on the down-converted tone component; and adjusting a down-converted inbound signal component of the down converted representation of the combination signal based on the transmit noise.

5. The radio front end of claim 1, wherein the processing module is further operation to:

generate a tuning signal based on electrical performance characteristic of duplexer;

send the tuning signal to the balancing network, which adjusts the impedance based on the tuning signal; and adjust the tuning signal based on inbound frequency band isolation.

6. The radio front end of claim 1 further comprises:

a front end module that includes the power amplifier, the tone injection module, the duplexer, and the tunable balancing network; and a system on a chip module that includes the processing module.

7. The radio front end of claim 1, wherein the outbound wireless signal is formed according to at least one of a cellular communication standard and a Wireless Local Area Network communication standard.

8. The radio front end of claim 1, wherein the processing module comprises a baseband processor.

9. The radio front end of claim 1, wherein the processing module comprises an application specific integrated circuit.

10. A radio front end comprises:

a power amplifier operably coupled to amplify an up-converted signal to produce an outbound wireless signal;

a tone injection module operable to produce a tone having a carrier frequency that is substantially similar to a carrier frequency of an inbound wireless signal;

a duplexer operably coupled to an antenna, the power amplifier, and the tone injection module, wherein the duplexer is operable to provide electrical isolation between the outbound wireless signal and a combination signal of the tone and the inbound wireless signal;

a balancing network operably coupled to the duplexer and operable to establish an impedance that substantially matches an impedance of the antenna based on a tuning signal;

a low noise amplifier operable to amplify the combination signal to produce an amplified combination signal;

a down conversion module operable to convert the amplified combination signal into a baseband or near-baseband signal; and a processing module operable in the first mode to:

generate the tuning signal based on an electrical performance characteristic of the duplexer;

convert the baseband or near-baseband signal into a baseband tone signal and a baseband inbound signal;

determine an inbound frequency band isolation based on the baseband tone signal; and adjust the tuning signal based on the inbound frequency band isolation.

11. The radio front end of claim 10, wherein the processing module is further operable to:

adjust the baseband inbound signal based on the inbound frequency band isolation to compensate for transmit noise in an inbound frequency band.

12. The radio front end of claim 10 further comprises:

a front end module that includes the power amplifier, the tone injection module, the duplexer, and the tunable balancing network; and a system on a chip module that includes the processing module, the low noise amplifier, and the down conversion module.

13. The radio front end of claim 10, wherein the processing module further functions to:

enable a first mode when noise of the inbound wireless signal compares favorably to a noise threshold; and enable a second mode when the noise of the inbound wireless signal compares unfavorably to the noise threshold, wherein the tone injection module is enabled to generate the tone in the first mode and is disabled in the second mode.

14. The radio front end of claim 10, wherein the outbound wireless signal is formed according to at least one of a cellular communication standard and a Wireless Local Area Network communication standard.

15. The radio front end of claim 10, wherein the processing module comprises a baseband processor.

16. The radio front end of claim 10, wherein the processing module comprises an application specific integrated circuit.

17. A system on a chip module comprises:

a low noise amplifier operable to amplify a combination signal to produce an amplified combination signal, wherein the combination signal is a combination of a tone and an inbound wireless signal received from a duplexer;

a down conversion module operable to convert the amplified combination signal into a baseband or near-baseband signal; and a processing module operable in a first mode to:

generate a tuning signal based on an electrical performance characteristic of the duplexer;

convert the baseband or near-baseband signal into a baseband tone signal and a baseband inbound signal;

determine an inbound frequency band isolation based on the baseband tone signal; and adjust the tuning signal based on the inbound frequency band isolation.

18. The system on a chip module of claim 17, wherein the processing module is further operable to:

adjust the baseband inbound signal based on the inbound frequency band isolation to compensate for transmit noise in an inbound frequency band.

19. The system on a chip module of claim 17, wherein the processing module further functions to:

enable a first mode when noise of the inbound wireless signal compares favorably to a noise threshold; and enable a second mode when the noise of the inbound wireless signal compares unfavorably to the noise threshold, wherein the tone injection module is enabled to generate the tone in the first mode and is disabled in the second mode.

20. The system on a chip module of claim 17, wherein the processing module comprises a baseband processor.

* * * * *